United States Patent
Lin et al.

(10) Patent No.: US 11,728,292 B2
(45) Date of Patent: Aug. 15, 2023

(54) SEMICONDUCTOR PACKAGE ASSEMBLY HAVING A CONDUCTIVE ELECTROMAGNETIC SHIELD LAYER

(71) Applicant: MediaTek Inc., Hsin-Chu (TW)

(72) Inventors: Tzu-Hung Lin, Hsin-Chu (TW); I-Hsuan Peng, Hsinchu (TW); Nai-Wei Liu, Hsin-Chu (TW); Wei-Che Huang, Zhudong Township, Hsinchu County (TW); Che-Ya Chou, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 166 days.

(21) Appl. No.: 16/779,217

(22) Filed: Jan. 31, 2020

(65) Prior Publication Data
US 2020/0168572 A1 May 28, 2020

Related U.S. Application Data

(60) Division of application No. 15/331,016, filed on Oct. 21, 2016, now abandoned, which is a (Continued)

(51) Int. Cl.
*H01L 23/552* (2006.01)
*H01L 23/66* (2006.01)
(Continued)

(52) U.S. Cl.
CPC .......... *H01L 23/66* (2013.01); *H01L 23/5383* (2013.01); *H01L 23/5384* (2013.01);
(Continued)

(58) Field of Classification Search
CPC ...................... H01L 23/552; H01L 2924/3025
See application file for complete search history.

(56) References Cited

U.S. PATENT DOCUMENTS 7,242,081 B1 7/2007 Lee
8,890,284 B2 11/2014 Kilger et al.
(Continued)

FOREIGN PATENT DOCUMENTS

CN 101971326 A 2/2011
CN 102468257 A 5/2012
(Continued)

*Primary Examiner* — Anh D Mai
(74) *Attorney, Agent, or Firm* — Wolf, Greenfield & Sacks, P.C.

(57) ABSTRACT

The invention provides a semiconductor package assembly. The semiconductor package assembly includes a first semiconductor package including a first redistribution layer (RDL) structure having a first surface and a second surface opposite to the first substrate. The first RDL structure includes a plurality of first conductive traces close to the first surface of the first RDL structure. An antenna pattern is disposed close to the second surface of the first RDL structure. A first semiconductor die is disposed on the first surface of the first RDL structure and electrically coupled to the first RDL structure. A plurality of conductive structures is disposed on the first surface of the first RDL structure and electrically coupled to the first RDL structure. The plurality of conductive structures is spaced apart from the antenna pattern through the plurality of first conductive traces of the first RDL structure.

18 Claims, 17 Drawing Sheets

Related U.S. Application Data continuation-in-part of application No. 15/130,994, filed on Apr. 17, 2016, now abandoned.

(60) Provisional application No. 62/335,093, filed on May 12, 2016, provisional application No. 62/321,237, filed on Apr. 12, 2016, provisional application No. 62/256,218, filed on Nov. 17, 2015, provisional application No. 62/157,046, filed on May 5, 2015.

(51) Int. Cl.
*H01L 23/538* (2006.01)
*H01L 25/16* (2023.01)
*H01L 23/00* (2006.01)
*H01L 25/10* (2006.01)
*H01L 23/498* (2006.01)

(52) U.S. Cl.
CPC ...... *H01L 23/5385* (2013.01); *H01L 23/5389* (2013.01); *H01L 23/552* (2013.01); *H01L 24/19* (2013.01); *H01L 24/20* (2013.01); *H01L 25/16* (2013.01); *H01L 23/49816* (2013.01); *H01L 25/105* (2013.01); *H01L 2223/6677* (2013.01); *H01L 2224/02379* (2013.01); *H01L 2224/04042* (2013.01); *H01L 2224/04105* (2013.01); *H01L 2224/12105* (2013.01); *H01L 2224/32225* (2013.01); *H01L 2224/73267* (2013.01); *H01L 2225/1035* (2013.01); *H01L 2225/1041* (2013.01); *H01L 2225/1058* (2013.01); *H01L 2924/1421* (2013.01); *H01L 2924/1435* (2013.01); *H01L 2924/1438* (2013.01); *H01L 2924/19011* (2013.01); *H01L 2924/19041* (2013.01); *H01L 2924/19042* (2013.01); *H01L 2924/19043* (2013.01); *H01L 2924/3025* (2013.01)

(56) References Cited

U.S. PATENT DOCUMENTS

| | | | |
|---|---|---|---|
| 9,190,367 | B1 | 11/2015 | Liao et al. |
| 9,324,657 | B2 | 4/2016 | Seo et al. |
| 9,570,418 | B2 | 2/2017 | Chen et al. |
| 9,633,974 | B2 | 4/2017 | Zhai et al. |
| 10,217,724 | B2 | 2/2019 | Lin et al. |
| 2003/0227095 | A1 | 12/2003 | Fujisawa et al. |
| 2005/0017346 | A1 | 1/2005 | Yamagata |
| 2007/0029667 | A1 | 2/2007 | Fujii et al. |
| 2007/0231962 | A1 | 10/2007 | Fuji |
| 2008/0041619 | A1 | 2/2008 | Lee et al. |
| 2008/0119013 | A1 | 5/2008 | Mangrum et al. |
| 2009/0014543 | A1 | 1/2009 | Yeo et al. |
| 2009/0072411 | A1 | 3/2009 | Tews et al. |
| 2009/0075428 | A1* | 3/2009 | Tang ............ H01L 23/552 438/114 |
| 2009/0237900 | A1 | 9/2009 | Origuchi et al. |
| 2010/0140779 | A1 | 6/2010 | Lin et al. |
| 2010/0237495 | A1 | 9/2010 | Pagaila et al. |
| 2011/0013349 | A1 | 1/2011 | Morikita et al. |
| 2011/0068468 | A1 | 3/2011 | Lin et al. |
| 2012/0133032 | A1 | 5/2012 | Tsai et al. |
| 2013/0009320 | A1 | 1/2013 | Yoo et al. |
| 2013/0292808 | A1 | 11/2013 | Yen et al. |
| 2013/0292809 | A1 | 11/2013 | Yoo et al. |
| 2014/0015131 | A1 | 1/2014 | Meyer et al. |
| 2014/0035097 | A1 | 2/2014 | Lin et al. |
| 2014/0168014 | A1 | 6/2014 | Chih et al. |
| 2014/0293529 | A1 | 10/2014 | Nair et al. |
| 2015/0061091 | A1 | 3/2015 | Seler et al. |
| 2015/0262902 | A1 | 9/2015 | Shen et al. |
| 2015/0303149 | A1* | 10/2015 | Zhai ............ H01L 24/97 257/659 |
| 2015/0325548 | A1 | 11/2015 | Read |
| 2015/0348920 | A1 | 12/2015 | Yap et al. |
| 2016/0218072 | A1 | 7/2016 | Liao et al. |
| 2016/0240492 | A1 | 8/2016 | Wolter et al. |
| 2016/0260684 | A1 | 9/2016 | Zhai et al. |
| 2016/0260693 | A1 | 9/2016 | Lin et al. |
| 2016/0293581 | A1 | 10/2016 | Lin et al. |
| 2016/0329299 | A1 | 11/2016 | Lin et al. |
| 2017/0040266 | A1 | 2/2017 | Lin et al. |
| 2017/0110413 | A1* | 4/2017 | Chen ............ H01L 24/20 |
| 2019/0252351 | A1 | 8/2019 | Lin et al. |

FOREIGN PATENT DOCUMENTS

| | | |
|---|---|---|
| CN | 103208472 A | 7/2013 |
| CN | 103730434 A | 4/2014 |
| CN | 103872012 A | 6/2014 |
| CN | 103887291 A | 6/2014 |
| CN | 104425465 A | 3/2015 |
| EP | 1648028 A1 | 4/2006 |
| EP | 2928013 A1 | 10/2015 |
| JP | 2004-186497 A2 | 7/2004 |
| TW | 200849503 A | 12/2008 |
| WO | WO 2009/035962 A2 | 3/2009 |
| WO | WO 2016/092692 A1 | 6/2016 |

* cited by examiner

ND A CONDUCTIVE
SEMICONDUCTOR PACKAGE ASSEMBLY HAVING A CONDUCTIVE ELECTROMAGNETIC SHIELD LAYER

CROSS REFERENCE TO RELATED APPLICATIONS

This Application is a Division of U.S. application Ser. No. 15/331,016, filed Oct. 21, 2016, entitled "SEMICONDUCTOR PACKAGE ASSEMBLY HAVING AN ANTENNA PATTERN FORMED ON A SURFACE OF A FIRST REDISTRIBUTION LAYER (RDL)", which is a Non-Prov of Prov (35 USC 119(e)) of U.S. Application Ser. No. 62/335,093, filed May 12, 2016. Application Ser. No. 15/331,016 is a Continuation-in-part of U.S. application Ser. No. 15/130,994, filed Apr. 17, 2016, which is a Non-Prov of Prov (35 USC 119(e)) of U.S. Application Ser. No. 62/256,218, filed Nov. 17, 2015. Application Ser. No. 15/130,994 is a Non-Prov of Prov (35 USC 119(e)) of U.S. Application Ser. No. 62/157,046, filed May 5, 2015. Application Ser. No. 15/331,016 is a Non-Prov of Prov (35 USC 119(e)) of U.S. Application Ser. No. 62/321,237, filed Apr. 12, 2016. The entire contents of these applications are incorporated herein by reference in their entirety.

BACKGROUND OF THE INVENTION

Field of the Invention

The present invention relates to a semiconductor package assembly, and in particular to a fan-out semiconductor package with an antenna integrated into a single redistribution layer (RDL) structure.

Description of the Related Art

In order to ensure the continued miniaturization and multi-functionality of electronic products and communication devices, it is desired that semiconductor packages be small in size, support multi-pin connection, operate at high speeds, and have high functionality. Additionally, in a high-frequency application, such as a radio frequency (RF) system-in-package (SiP) assembly, antennas are typically used for enabling wireless communication.

In a conventional SiP structure, a discrete antenna component is individually encapsulated or mounted on a printed circuit board (PCB) or package. However, the PCB is required to provide additional area for the antenna component mounted thereon. As a result, it is difficult to reduce the size of the package. Additionally, the total height of the SiP structure is increased when the antenna component is mounted on the package. Moreover, in this case, since the antenna component is typically mounted on the package by a surface mount technology (SMT) process, poor SMT process control may induce delamination between the antenna component and the underlying package. As a result, reliability, yield, and throughput of the semiconductor package structure are reduced.

Thus, a novel semiconductor package assembly is desirable.

BRIEF SUMMARY OF THE INVENTION

A semiconductor package assembly is provided. An exemplary embodiment of a semiconductor package assembly includes a first semiconductor package including a first redistribution layer (RDL) structure having a first surface and a second surface opposite to the first substrate. The first RDL structure includes a plurality of first conductive traces close to the first surface of the first RDL structure. An antenna pattern is disposed close to the second surface of the first RDL structure. A first semiconductor die is disposed on the first surface of the first RDL structure and electrically coupled to the first RDL structure. A plurality of conductive structures is disposed on the first surface of the first RDL structure and electrically coupled to the first RDL structure. The plurality of conductive structures is spaced apart from the antenna pattern through the plurality of first conductive traces of the first RDL structure.

Another exemplary embodiment of a semiconductor package assembly includes a first semiconductor package including a first redistribution layer (RDL) structure having a first surface and a second surface opposite to the first substrate. The first RDL structure includes an antenna pattern close to the second surface of the first RDL structure. A plurality of first conductive traces is disposed close to the first surface of the first RDL structure. A first molding material fills the gaps between the antenna pattern and the plurality of first conductive traces. A plurality of first conductive structures is disposed on the first surface of the first RDL structure and electrically coupled to the first RDL structure. The plurality of conductive structures is spaced apart from the antenna pattern through the plurality of first conductive traces of the first RDL structure.

Yet another exemplary embodiment of a semiconductor package assembly includes a first semiconductor package including a first redistribution layer (RDL) structure having a first surface and a second surface opposite to the first substrate. The first RDL structure includes an antenna pattern close to the second surface of the first RDL structure. A first semiconductor die is disposed on the first surface of the first RDL structure and electrically coupled to the first RDL structure. A plurality of conductive structures is disposed on the first surface of the first RDL structure. The plurality of conductive structures is electrically coupled to the first semiconductor die through the first RDL structure. The first semiconductor die comprises a front side and a back side, and wherein pads of the first semiconductor die and the plurality of conductive structures are disposed on the front side and the back side of the first semiconductor die, respectively.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
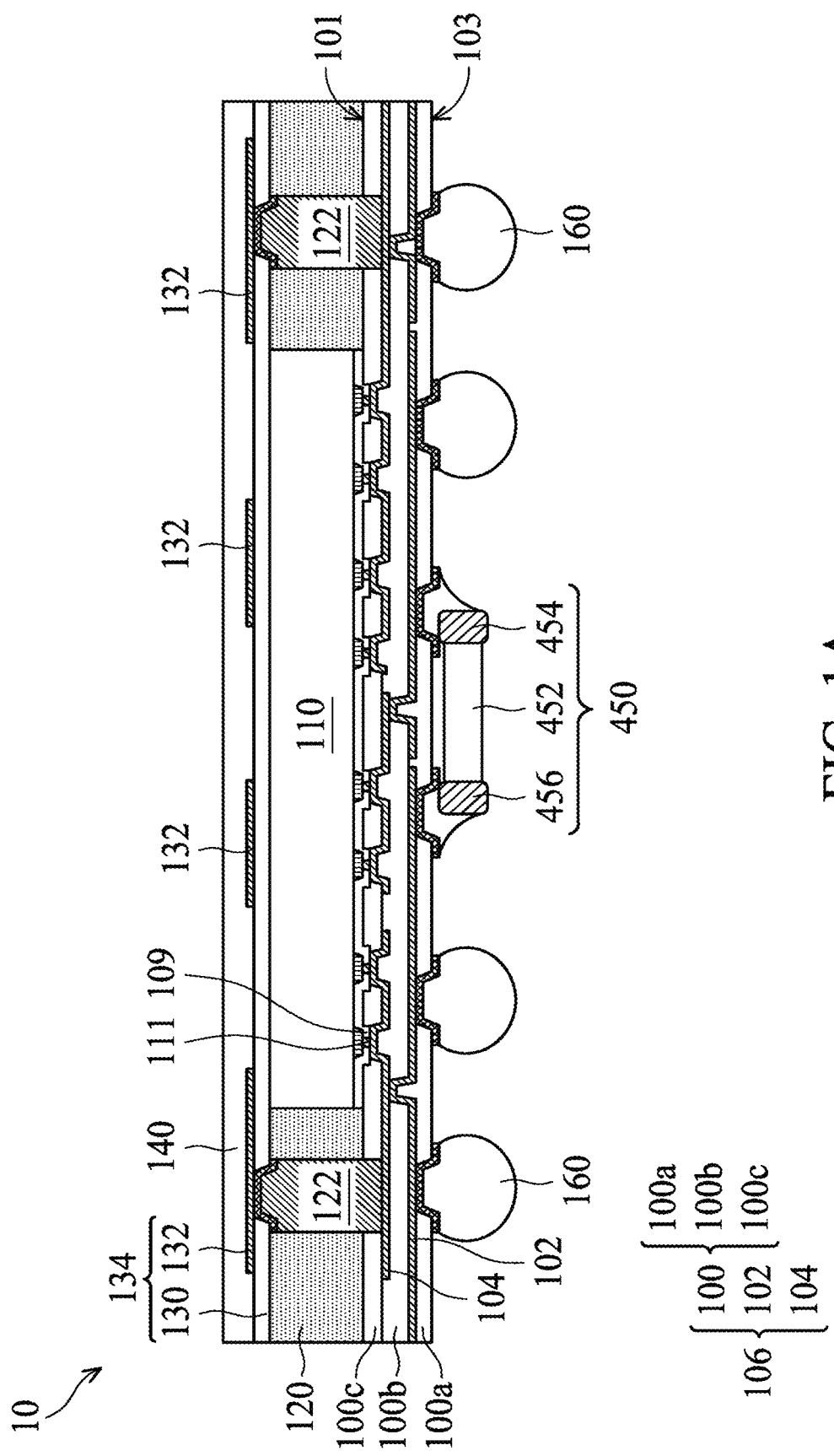
FIG. 1A is a cross-sectional view of an exemplary semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
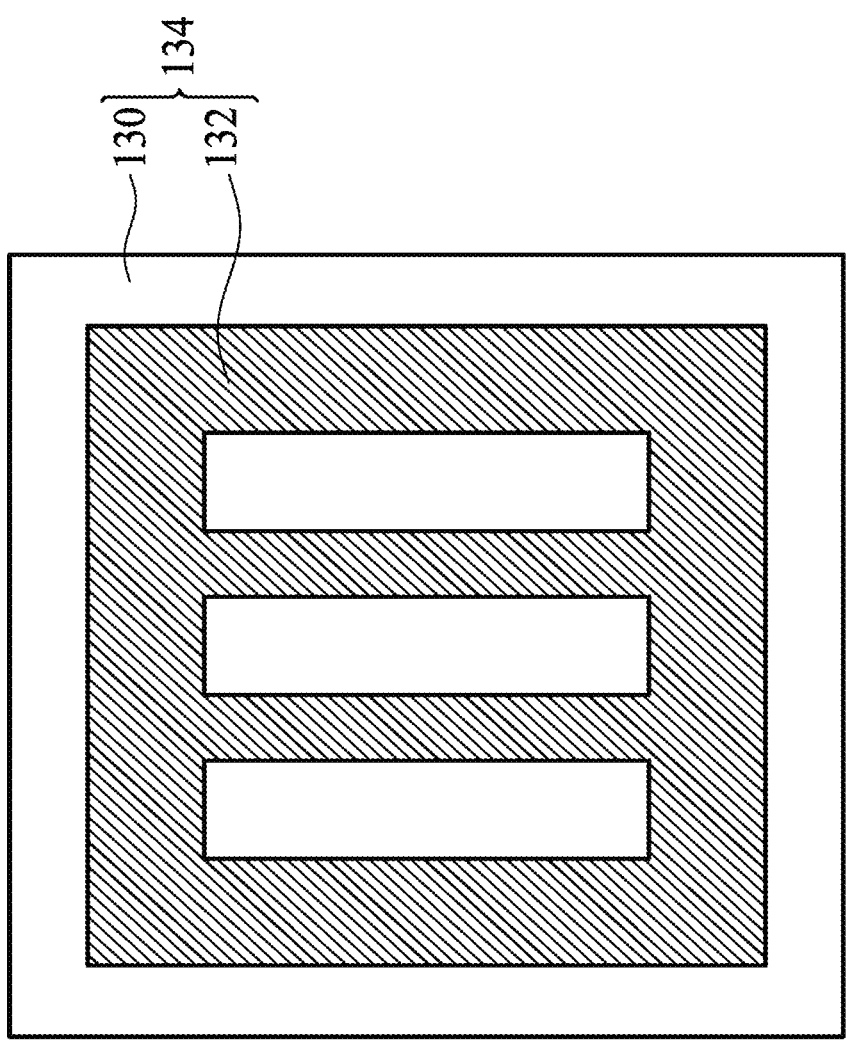
FIG. 1B is a plan view of an IMD structure of the semiconductor package structure shown in FIG. 1A.

FIG. 1A is a cross-sectional view of a semiconductor package structure 10 in accordance with some embodiments of the disclosure. FIG. 1B is a plan view of an IMD structure 134 of the semiconductor package structure 10 shown in FIG. 1A. In some embodiments, the semiconductor package structure 10 is a wafer-level semiconductor package structure, for example, a flip-chip semiconductor package structure.

Referring to FIG. 1A, the semiconductor package structure 10 includes a first semiconductor package, such as a wafer-level semiconductor package, that may be mounted on a base (not shown). In some embodiments, the first semiconductor package may include a system-on-chip (SOC) package. Moreover, the base may include a printed circuit board (PCB) and may be formed of polypropylene (PP). In some embodiments, the base may include a package substrate. The first semiconductor package of the semiconductor package structure 10 is mounted on the base by a bonding process. For example, the first semiconductor package includes a plurality of first conductive structures 160 that is mounted on and electrically coupled to the base by the bonding process.

The first semiconductor package includes a first semiconductor die 110 and a first RDL structure 106. The first semiconductor die 110, for example, may include a microcontroller (MCU), a microprocessor (MPU), a random access memory (RAM), a power management integrated circuit (PMIC), a flash memory, a global positioning system (GPS) device, or a radio frequency (RF) device or any combination thereof. Moreover, for example, the first conductive structures 160 may comprise a conductive bump structure such as a copper bump or a solder bump structure, a conductive pillar structure, a conductive wire structure, or a conductive paste structure.

As shown in FIG. 1A, the first semiconductor die 110 is fabricated by flip-chip technology. Pads 109 of the first semiconductor die 110 are electrically connected to the circuitry (not shown) of the first semiconductor die 110. In some embodiments, the pads 109 belong to the uppermost metal layer of the interconnection structure (not shown) of the first semiconductor die 110. The pads 109 of the first semiconductor die 110 are in contact with the corresponding conductive structures 111, for example, conductive bumps, posts or solder pastes. It should be noted that the number of semiconductor dies integrated in the semiconductor package structure 10 is not limited to that disclosed in the embodiment.

The first RDL structure 106, which is also referred to as a fan-out structure, has a first surface 101 and a second surface 103 opposite thereto. The first semiconductor die 110 is disposed on the first surface 101 of the first RDL structure 106. The first semiconductor die 110 is connected to the first RDL structure 106 through the conductive structures 111.

In the embodiment, the first RDL structure 106 includes one or more conductive traces disposed in an inter-metal dielectric (IMD) layer 100. For example, a plurality of first conductive traces 104 is disposed at a first layer-level of the IMD layer 100 and at least one of the first conductive traces 104 is electrically coupled to the first semiconductor die 110. Moreover, a plurality of second conductive traces 102 is disposed at a second layer-level different from the first layer-level of the IMD layer 100. In this case, the IMD layer 100 may include first, second, and third sub-dielectric layers 100a, 100b, and 100c successively stacked from the second surface 103 of the first RDL structure 106 toward the first surface 101 of the first RDL structure 106, such that the first conductive traces 104 are positioned on the third sub-dielectric layer 100c and the second conductive traces 102 are positioned on the second sub-dielectric layer 100b and covered by the first sub-dielectric layer 100a. Also, the first conductive traces 104 are separated from the second conductive traces 102 by the second sub-dielectric layer 100b. In some embodiments, the IMD layer 100 may be formed of organic materials, which include a polymer base material, non-organic materials, which include silicon nitride ($SiN_x$), silicon oxide ($SiO_x$), graphene, or the like. For example, the first, second, third sub-dielectric layers 100a, 100b, and 100c are made of a polymer base material.

In some embodiments, the IMD layer 100 is a high-k dielectric layer (k is the dielectric constant of the dielectric layer). In some other embodiments, the IMD layer 100 may be formed of a photo sensitive material, which includes a dry film photoresist, or a taping film.

Pad portions of the second conductive traces 102 are exposed to openings of the first sub-dielectric layers 100a and connected to the first conductive structures 160 that are disposed on the second surface 103 of the first RDL structure 106. Also, it should be noted that the number of conductive traces and the number of sub-dielectric layers of the first RDL structure 106 shown in FIG. 1A is only an example and is not a limitation to the present invention.

In the embodiment, the first semiconductor package further includes at least one electronic component 450, such as an integrated passive device (IPD), disposed on the second surface 103 of the first RDL structure 106. The IPD is electrically coupled to the first semiconductor die 110 through the first RDL structure 106. In some embodiments, the IPD may include a capacitor, an inductor, a resistor, or a combination thereof. Moreover, the IPD includes at least one electrode electrically coupled to one of the second conductive traces 102. For example, the electronic component 450 may be a capacitor that is electrically coupled to the first semiconductor die 110. In this case, the capacitor includes a body 452 and first and second electrode layers 454 and 456 respectively disposed on two ends of the body 452. Moreover, the first and second electrode layers 454 and 456 are respectively electrically coupled to at least two of the second conductive traces 102.

In the embodiment, as shown in FIG. 1A, the first semiconductor package further includes a first molding compound 120 disposed on the first surface 101 of the first RDL structure 106 and surrounding the first semiconductor die 110. In some embodiments, the first molding compound 120 may be formed of an epoxy, a resin, a moldable polymer, or the like. The first molding compound 120 may be applied while substantially liquid, and then may be cured through a chemical reaction, such as in an epoxy or resin. In some other embodiments, the first molding compound 120 may be an ultraviolet (UV) or thermally cured polymer applied as a gel or malleable solid capable of being disposed around the first semiconductor die 110, and then may be cured through a UV or thermal curing process. The first molding compound 120 may be cured with a mold (not shown).

In the embodiment, the first molding compound 120 includes first vias 122 passing through it. The first vias 122 are electrically coupled to the first conductive traces 104 of the first RDL structure 106. Moreover, the first semiconductor die 110 may be surrounded by the first vias 122. In some embodiments, the first vias 122 may comprise through package vias (TPVs) formed of copper.

The first conductive structures 160 are separated from the first molding compound 120 through the first RDL structure 106. In other words, the first conductive structures 160 are free from contact with the first molding compound 120. In some embodiments, the first conductive structures 160 may comprise a conductive bump structure (such as a copper or solder bump structure), a conductive pillar structure, a conductive wire structure, or a conductive paste structure.

In the embodiment, as shown in FIG. 1A, the first semiconductor package further includes an IMD structure 134 disposed on the first molding compound 120 and the first semiconductor die 110. The methods and materials used for forming the IMD structure 134 may be the same as or similar to those of the first RDL structure 106. In other words, the process for forming the first RDL structure 106 can be used for forming the IMD structure 134. In the embodiment, the IMD structure 134 includes a conductive layer 132 with an antenna pattern disposed on a dielectric layer 130 and electrically coupled to the first RDL structure 106 through the first vias 122. In some embodiments, the conductive layer 132 with an antenna pattern may be embedded within the dielectric layer 130. The methods and materials used for forming the conductive layer 132 with an antenna pattern may be the same as or similar to those of the first conductive traces 104 and the second conductive traces 102. Moreover, the dielectric layer 130 may be a single layer or a multi-layer structure. Also, the methods and materials used for forming the dielectric layer 130 may be the same as or similar to those of the first, second, or third sub-dielectric layer 100a, 100b, or 100c.

In the embodiment, the antenna pattern of the conductive layer 132 is a fence pattern in a top view, as shown in FIG. 1B. However, it should be understood that those of ordinary skill in the art know that various shapes can be used for the antenna pattern of the conductive layer 132. The conductive layer 132 with an antenna pattern enables wireless communication for the semiconductor package structure 10.

In the embodiment, as shown in FIG. 1A, the first semiconductor package further includes an optional passivation layer 140 covering the IMD structure 134, so as to protect the conductive layer 132 with an antenna pattern from damage. The passivation layer 140 may be composed of a material that is the same as or different from that of the dielectric layer 130. For example, the passivation layer 140 may comprise an epoxy, a solder mask, an inorganic material (e.g., silicon nitride (SiNX), silicon oxide (SiOX), graphene, or the like), or an organic polymer base material. In cases where the conductive layer 132 with an antenna pattern is embedded within the dielectric layer 130, the passivation layer 140 may be omitted.

Figure 2:
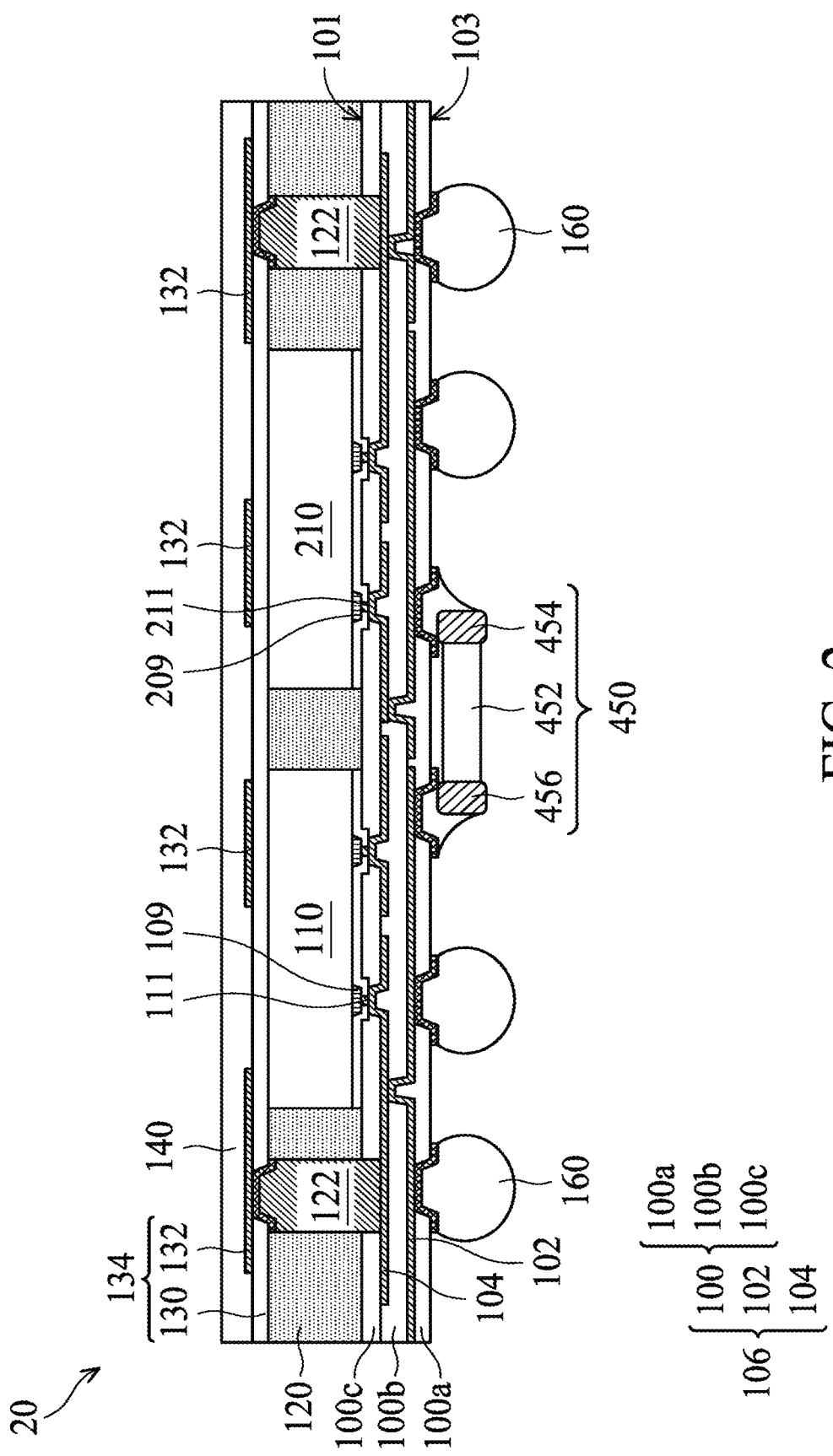
FIG. 2 is a cross-sectional view of an exemplary semiconductor package structure with two semiconductor dies arranged side-by-side in accordance with some embodiments of the disclosure.

FIG. 2 is a cross-sectional view of an exemplary semiconductor package structure 20 with first and second semiconductor dies 110 and 210 arranged side-by-side in accordance with some embodiments of the disclosure. Descriptions of elements of the embodiments hereinafter that are the same as or similar to those previously described with reference to FIG. 1A are omitted for brevity. In the embodiment, the semiconductor package structure 20 is similar to the semiconductor package structure 10 shown in FIG. 1A, except that the first semiconductor package of the semiconductor package structure 20 further includes a second semiconductor die 210 disposed on the first surface 101 of the first RDL structure 106 and surrounded by the first molding compound 120 and the first vias 122. In the embodiment, the first and second semiconductor dies 110 and 210 are arranged side-by-side. Pads 209 of the second semiconductor die 210 are electrically connected to the circuitry (not shown) of the second semiconductor die 210. In some embodiments, the pads 209 belong to the uppermost metal layer of the interconnection structure (not shown) of the second semiconductor die 210. The pads 209 of the second semiconductor die 210 are in contact with the corresponding conductive structures 211, for example, conductive bumps, posts or solder pastes. The second semiconductor die 210 is electrically coupled to the first semiconductor die 110 through the pads 209, conductive structures 211, and the first RDL structure 106. It should be noted that the number of semiconductor dies integrated in the semiconductor package structure 20 is not limited to that disclosed in the embodiment.

In some embodiments, the second semiconductor die 210 may include an MCU), an MPU, a RAM, a PMIC, a flash memory, a GPS device, or an RF device or any combination thereof. In some embodiments, at least one of the first and second semiconductor dies 110 and 210 is a SOC die. For example, the first and second semiconductor dies 110 and 210 are SOC dies. Alternatively, the first semiconductor die 110 is a SOC die, and the second semiconductor die 210 is a memory die. Therefore, the first semiconductor package of the semiconductor package assembly 20 may include a pure SOC package or a hybrid SOC package. However, the number and the arrangement of semiconductor dies are not limited to the disclosed embodiment.

Figure 3:
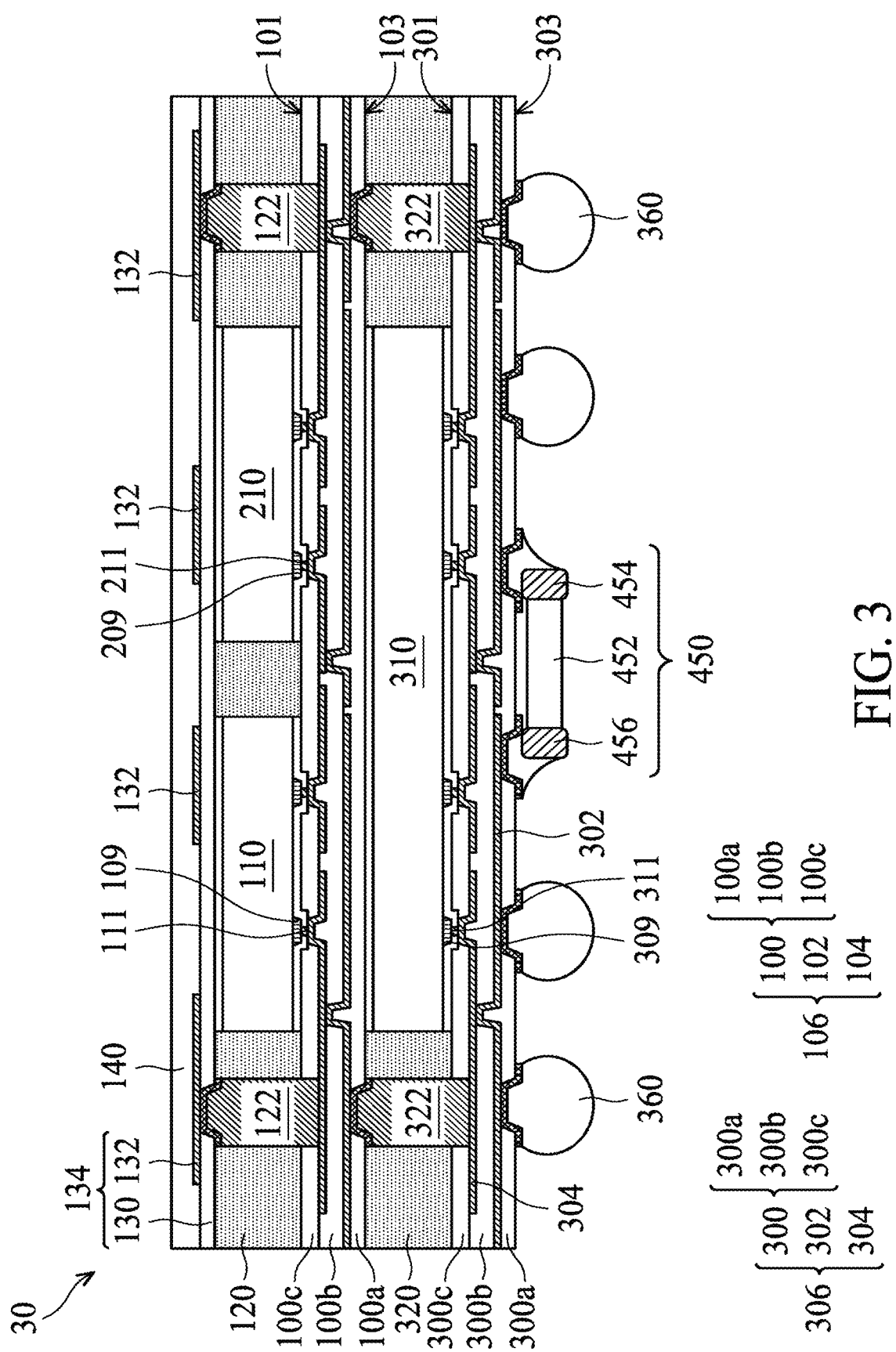
FIG. 3 is a cross-sectional view of an exemplary semiconductor package structure with a package on package (PoP) structure in accordance with some embodiments of the disclosure.

FIG. 3 is a cross-sectional view of an exemplary semiconductor package structure 30 with a package on package (PoP) structure in accordance with some embodiments of the disclosure. Descriptions of elements of the embodiments hereinafter that are the same as or similar to those previously described with reference to FIGS. 1A and 2 are omitted for brevity. In the embodiment, the semiconductor package structure 30 is similar to the semiconductor package structure 20 shown in FIG. 2, except that the semiconductor package structure 30 further includes a second semiconductor package stacked below the first semiconductor package of the semiconductor package structure 20. In some embodiments, the semiconductor package structure 30 is similar to the semiconductor package structure 10 shown in FIG. 1A, except that the semiconductor package structure 30 further includes a second semiconductor package stacked below the first semiconductor package of the semiconductor package structure 10.

In the embodiment, the second semiconductor package has a structure similar to that of the first semiconductor package of the semiconductor package structure 10 shown in FIG. 1A. The second semiconductor package, such as a wafer-level semiconductor package, that may be mounted on a base (not shown). In some embodiments, the second semiconductor package may include a SOC package. Moreover, the second semiconductor package of the semiconductor package structure 30 is mounted on the base via a plurality of second conductive structures 360 using a bonding process. The second conductive structures 360 may be the same as or similar to the first conductive structures 160.

The second semiconductor package includes a third semiconductor die 310 and a second RDL structure 306. The third semiconductor die 310, for example, may include an MCU, an MPU, a RAM, a PMIC, a flash memory, a GPS device, or a RF device or any combination thereof. Similarly, the third semiconductor die 310 is fabricated by flip-chip technology. Pads 309 of the third semiconductor die 310 are electrically connected to the circuitry (not shown) of the third semiconductor die 310. In some embodiments, the pads 309 belong to the uppermost metal layer of the interconnection structure (not shown) of the third semiconductor die 310. The pads 309 of the third semiconductor die 310 are in contact with the corresponding conductive structures 311, for example, conductive bumps, posts or solder pastes. It should be noted that the number of semiconductor dies integrated in the second semiconductor package is not limited to that disclosed in the embodiment.

The second RDL structure 306, which is also referred to as a fan-out structure, has a third surface 301 and a fourth surface 603 opposite thereto. The third semiconductor die 310 is disposed on the third surface 301 of the second RDL structure 306. The third semiconductor die 310 is connected to the second RDL structure 306 through the conductive structures 311.

In the embodiment, the second RDL structure 306 has a structure that is the same as or similar to that of the first RDL structure 106. For example, a plurality of first conductive traces 304 is disposed at a first layer-level of the IMD layer 300 and at least one of the first conductive traces 304 is electrically coupled to the third semiconductor die 310. Moreover, a plurality of second conductive traces 302 is disposed at a second layer-level different from the first layer-level of the IMD layer 300. In this case, the IMD layer 300 may include first, second, and third sub-dielectric layers 300a, 300b, and 300c successively stacked from the second surface 303 of the second RDL structure 306 toward the first surface 301 of the second RDL structure 306, such that the first conductive traces 304 are positioned on the third sub-dielectric layer 300c and the second conductive traces 302 are positioned on the second sub-dielectric layer 300b and covered by the first sub-dielectric layer 300a. Also, the first conductive traces 304 are separated from the second conductive traces 302 by the second sub-dielectric layer 300b. In some embodiments, the IMD layer 300 may be formed of a material that is the same as or similar to that of the IMD layer 100.

Pad portions of the second conductive traces 302 are exposed to openings of the first sub-dielectric layers 300a and connected to the second conductive structures 360 that are disposed on the second surface 303 of the second RDL structure 306. Also, it should be noted that the number of conductive traces and the number of sub-dielectric layers of the second RDL structure 306 shown in FIG. 3 is only an example and is not a limitation to the present invention.

In the embodiment, the second semiconductor package further includes an electronic component 450 that is disposed on the fourth surface 303 of the second RDL structure 306. The electronic component 450, such as a capacitor, includes a body 452 and first and second electrode layers 454 and 456 respectively disposed on two ends of the body 452 and respectively electrically coupled to at least two of the second conductive traces 302.

In the embodiment, as shown in FIG. 3, the second semiconductor package further includes a second molding compound 320 disposed on the first surface 301 of the second RDL structure 306 and surrounding the third semiconductor die 310. In some embodiments, the second molding compound 320 may be formed of a material that is the same as or similar to that of first molding compound 120.

In the embodiment, the second molding compound 320 includes second vias 322 passing through it. The second vias 322 are electrically coupled to the first conductive traces 304 of the second RDL structure 306, so as to form an electrical connection between the first and second RDL structures 106 and 306. Moreover, the third semiconductor die 310 may be surrounded by the second vias 322. In some embodiments, the second vias 322 may comprise TPVs formed of copper. Also, the second conductive structures 360 are separated from the second molding compound 320 through the second RDL structure 306.

According to the foregoing embodiments, the semiconductor package structure is designed to fabricate an antenna integrated into the first semiconductor package(s). The antenna provides wireless communication and a compatible process for the semiconductor package structure. Accordingly, there is no need to perform an SMT process for forming the antenna device. As a result, reliability, yield, and throughput of the semiconductor package structure are increased and the manufacturing cost of the semiconductor package structure is reduced. Additionally, the integrated antenna can provide design flexibility for the system integration of the semiconductor package structure.

Figure 4A:
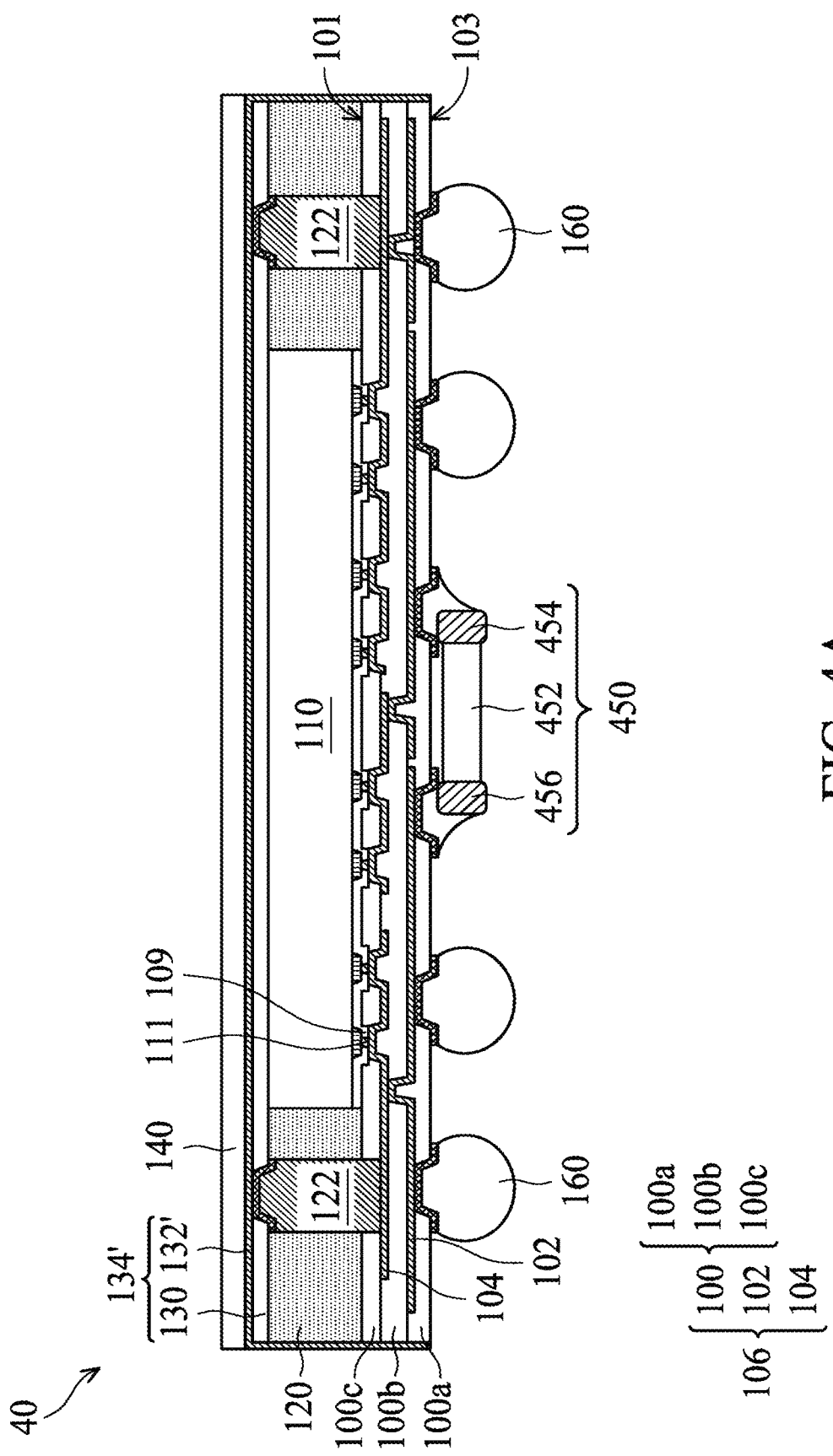
FIG. 4A is a cross-sectional view of an exemplary semiconductor package structure in accordance with some embodiments of the disclosure.
Figure 4B:
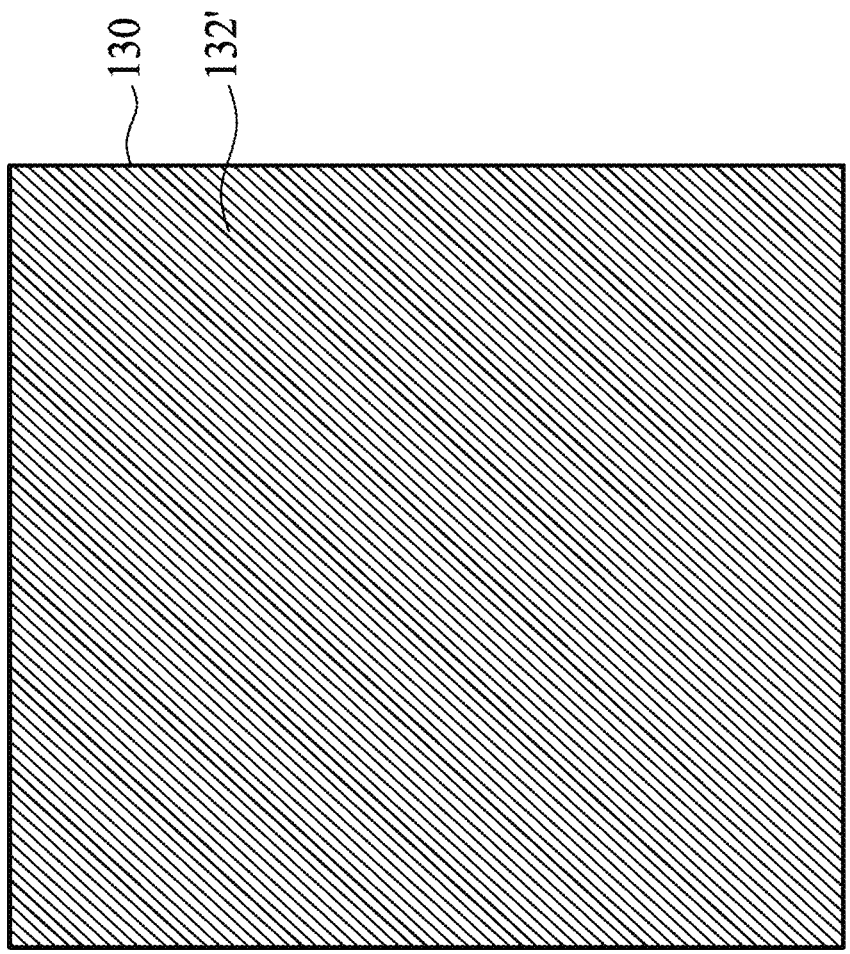
FIG. 4B is a plan view of an IMD structure of the semiconductor package structure shown in FIG. 4A.

FIG. 4A is a cross-sectional view of a semiconductor package structure 40 in accordance with some embodiments of the disclosure. FIG. 4B is a plan view of an IMD structure 134' of the semiconductor package structure 40 shown in FIG. 4A. Descriptions of elements of the embodiments hereinafter that are the same as or similar to those previously described with reference to FIGS. 1A and 1B are omitted for brevity. In the embodiment, the semiconductor package structure 40 is similar to the semiconductor package structure 10 shown in FIG. 1A, except that the IMD structure 134' of the semiconductor package structure 40 has a conductive shielding layer 132' that covers the first semiconductor die 110 and is uncovered by any passivation layer. As shown in FIG. 4B, unlike the conductive layer 132 with an antenna pattern shown in FIG. 1A, the conductive shielding layer 132' is a solid/continuous layer without any pattern/opening therein. The conductive shielding layer 132' is disposed on and substantially covers the entire upper surface of the dielectric layer 130. Moreover, the conductive shielding layer 132' further extends along the sidewalls of the dielectric layer 130, the first molding compound 120, and the IMD layer 100 to the second surface 103 of the first RDL structure 106, so that the sidewall of the semiconductor package structure 40 is substantially covered by the conductive shielding layer 132'. In the embodiment, the conductive shielding layer 132' is electrically coupled to at least one of the first vias 122. The conductive shielding layer 132' is employed to reduce electrical noise from affecting the signals, and to reduce electromagnetic radiation that may interfere with other devices.

In the embodiment, the methods and materials used for forming the IMD structure 134' are the same as or similar to those of the IMD structure 134 shown in FIG. 1A. In other words, the methods and materials used for forming the conductive shielding layer 132' are the same as or similar to those of the conductive layer 132 with an antenna pattern shown in FIG. 1A.

Figure 5:
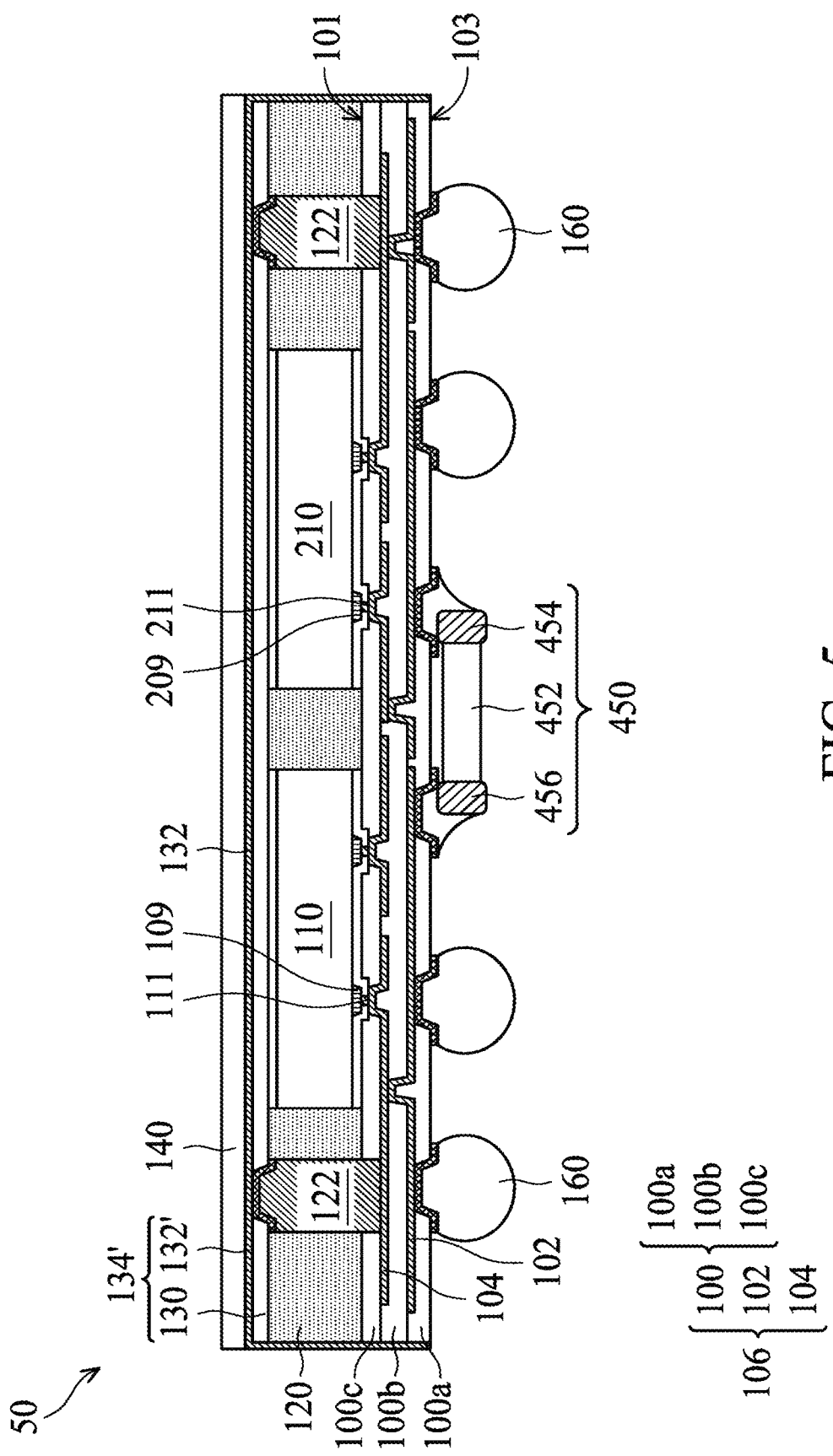
FIG. 5 is a cross-sectional view of an exemplary semiconductor package structure with two semiconductor dies arranged side-by-side in accordance with some embodiments of the disclosure.

FIG. 5 is a cross-sectional view of an exemplary semiconductor package structure 50 with first and second semiconductor dies 110 and 210 arranged side-by-side in accordance with some embodiments of the disclosure. Descriptions of elements of the embodiments hereinafter that are the same as or similar to those previously described with reference to FIGS. 4A and 2 are omitted for brevity. In the embodiment, the semiconductor package structure 50 is similar to the semiconductor package structure 20 shown in FIG. 2, except that the IMD structure 134' of semiconductor package structure 50 has a conductive shielding layer 132' that covers the first and second semiconductor dies 110 and 210 and is uncovered by any passivation layer. Also, as shown in FIG. 5, the conductive shielding layer 132' further extends along the sidewalls of the dielectric layer 130, the first molding compound 120, and the IMD layer 100 to the second surface 103 of the first RDL structure 106, so that the sidewall of the semiconductor package structure 50 is substantially covered by the conductive shielding layer 132'. In the embodiment, the conductive shielding layer 132' is electrically coupled to at least one of the first vias 122 to reduce electrical noise from affecting the signals, and to reduce electromagnetic radiation that may interfere with other devices.

Figure 6:
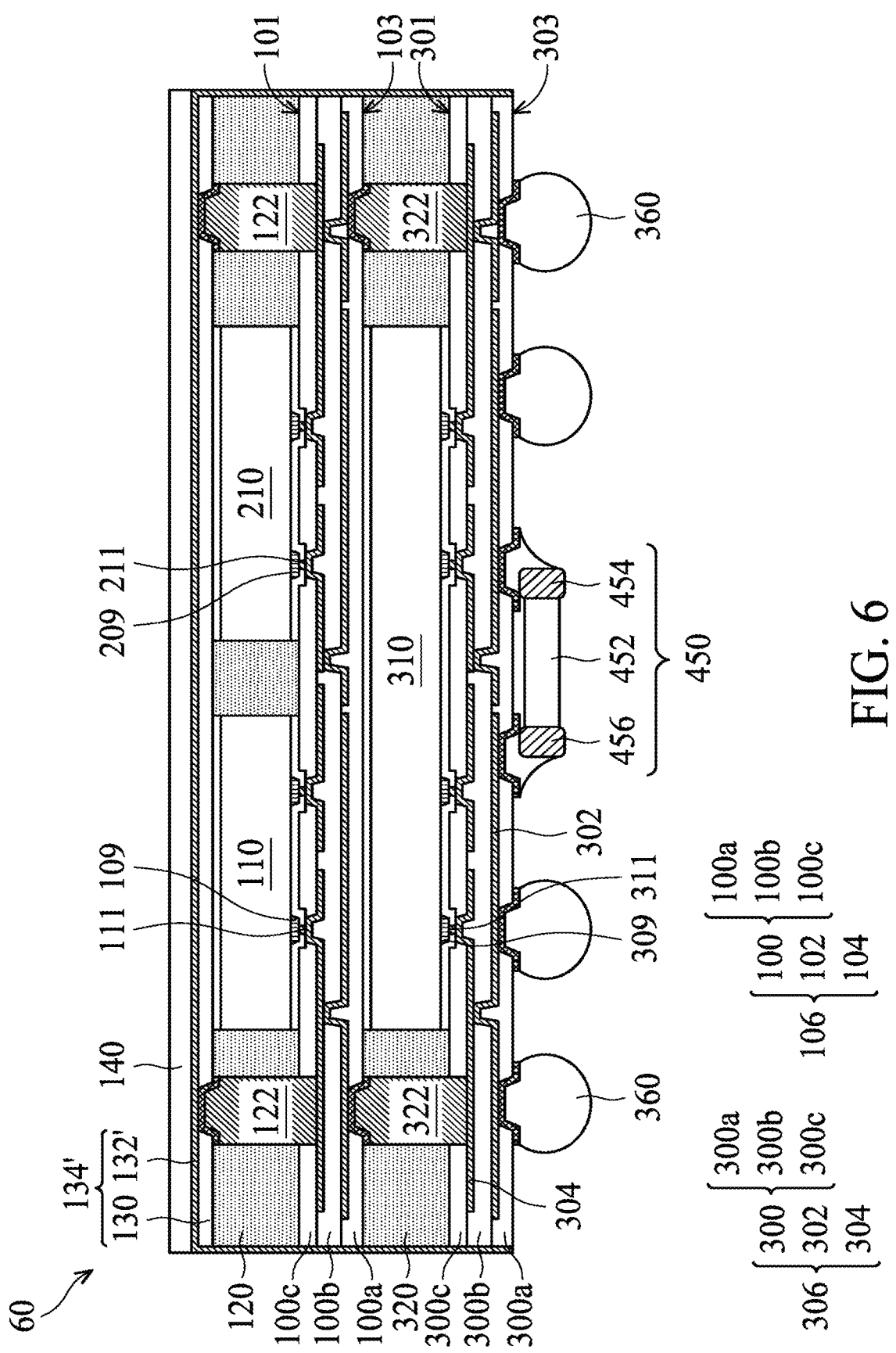
FIG. 6 is a cross-sectional view of an exemplary semiconductor package structure with a package on package (PoP) structure in accordance with some embodiments of the disclosure.

FIG. 6 is a cross-sectional view of an exemplary semiconductor package structure 60 with a PoP structure in accordance with some embodiments of the disclosure. Descriptions of elements of the embodiments hereinafter that are the same as or similar to those previously described with reference to FIGS. 4A and 3 are omitted for brevity. In the embodiment, the semiconductor package structure 60 is similar to the semiconductor package structure 30 shown in FIG. 3, except that the IMD structure 134' of semiconductor package structure 60 has a conductive shielding layer 132' that covers the first and second semiconductor dies 110 and 210 and is uncovered by any passivation layer. Similarly, as shown in FIG. 6, the conductive shielding layer 132' further extends along the sidewalls of the dielectric layer 130, the first molding compound 120, the IMD layer 100, the second molding compound 320, and the IMD layer 300 to the second surface 103 of the second RDL structure 306, so that the sidewall of the semiconductor package structure 60 is substantially covered by the conductive shielding layer 132'. In the embodiment, the conductive shielding layer 132' is electrically coupled to at least one of the first vias 122 to reduce electrical noise from affecting the signals, and to reduce electromagnetic radiation that may interfere with other devices.

According to the foregoing embodiments, the semiconductor package structure is designed to fabricate a shielding layer integrated into the semiconductor package(s). The shielding layer provides the function of reducing electrical noise and electromagnetic radiation and a compatible process for the semiconductor package structure. Accordingly, there is no need to perform an additional process for forming the shielding device. As a result, reliability, yield, and throughput of the semiconductor package structure are increased and the manufacturing cost of the semiconductor package structure is reduced. Additionally, the integrated shielding layer can provide design flexibility for the system integration of the semiconductor package structure.

In some embodiments, the semiconductor package assembly is designed to integrate an antenna into a single redistribution layer (RDL) structure. Also, the RDL structure with an antenna integrated within and the conductive bump structure are disposed on opposite sides of the semiconductor die. The RDL structure with an antenna integrated within can combine the functions of wireless communication in a single RDL structure.

Figure 7A:
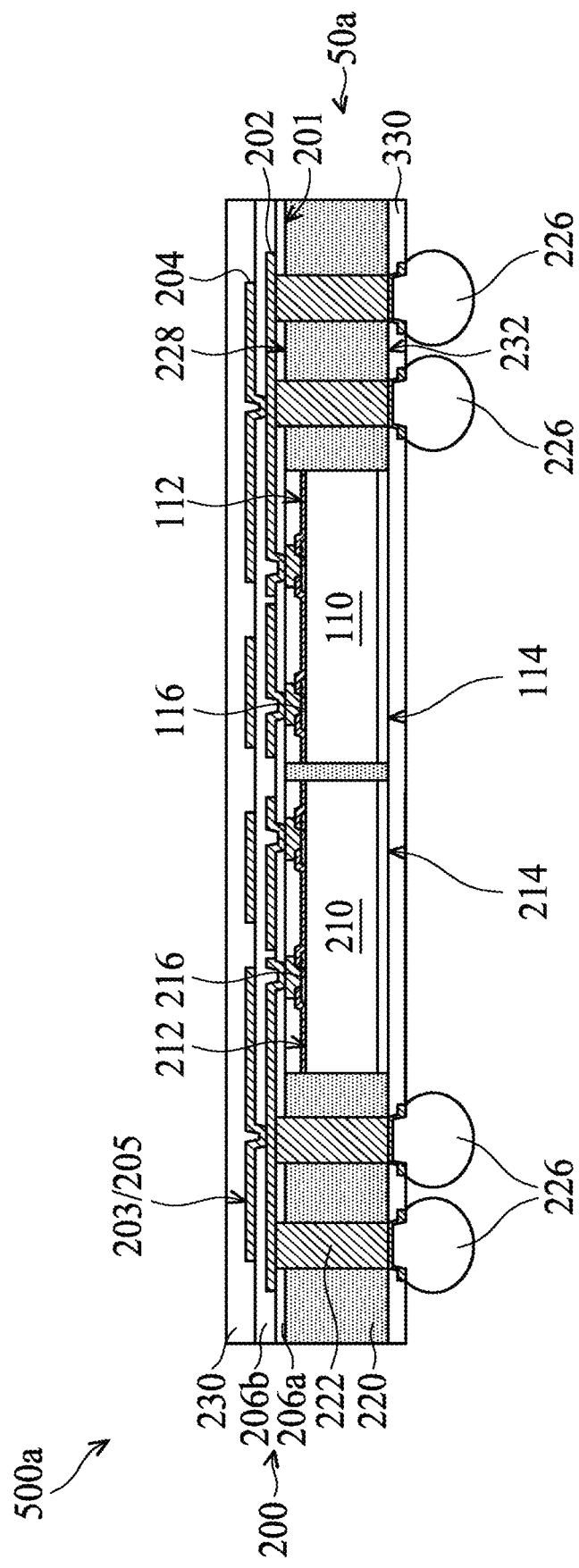
FIG. 7A is a cross-sectional view of a semiconductor package assembly in accordance with some embodiments of the disclosure.
Figure 7B:
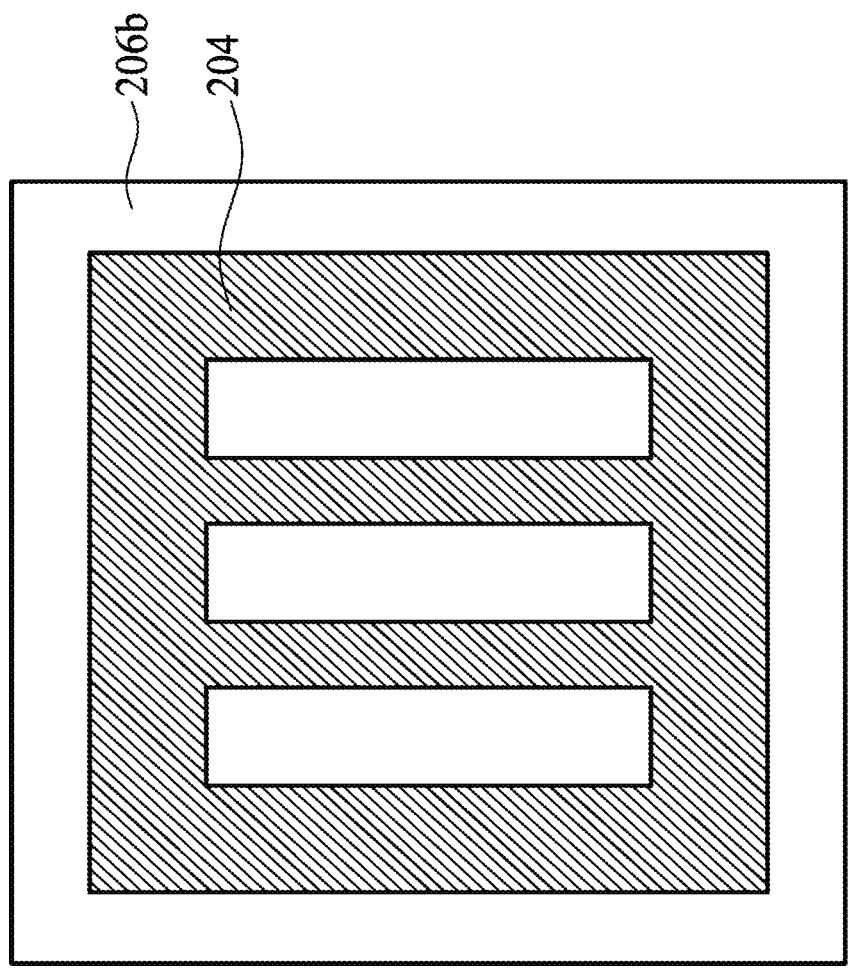
FIG. 7B is a plan view of a redistribution layer (RDL) structure of the semiconductor package assembly as shown in FIG. 7A.

FIG. 7A is a cross-sectional view of a semiconductor package assembly 500a in accordance with some embodiments of the disclosure. FIG. 7B is a plan view of a redistribution layer (RDL) structure 200 of the semiconductor package assembly 500a as shown in FIG. 7A. In some embodiments, the semiconductor package assembly 500a is a fan-out wafer-level semiconductor package (FOWLP) for example, the flip-chip semiconductor package.

As shown in FIG. 7A, the semiconductor package assembly 500a includes a wafer-level first semiconductor package 50a. Also, the semiconductor package assembly 500a may include a pure system-on-chip (SOC) package or a hybrid system-on-chip (SOC) package (including a dynamic random access memory (DRAM), a power management integrated circuit (PMIC), a flash memory, a global positioning system (GPS) device or a radio frequency (RF) device). The first semiconductor package 50a is mounted on the base (not shown), for example a printed circuit board (PCB) formed of polypropylene (PP), by a bonding process.

As shown in FIG. 7A, the first semiconductor package 50a includes a redistribution layer (RDL) structure 200, a semiconductor die 110 and a semiconductor die 210.

In some embodiments, the RDL structure 200 includes a plurality of conductive traces 202, an antenna pattern 204 and inter-metal dielectric (IMD) layers 206a and 206b. The RDL structure 200 has a first surface 201 and a second surface 203 opposite to the first substrate 201. The plurality of conductive traces 202 is disposed on the IMD layer 206a and close to the first surface 201 of the RDL structure 200. The antenna pattern 204 is disposed on the IMD layer 206b close to the second surface 203 of the RDL structure 200. In some embodiments, a top surface 205 of the antenna pattern 204 is higher than that of the on the IMD layer 206b. Therefore, the top surface 205 of the antenna pattern 204 may serve as the second surface 203 of the RDL structure 200. The plurality of conductive traces 202 and the antenna pattern 204 disposed in the IMD layers 206a and 206b are in different layer-levels. The plurality of conductive traces 202 is electrically coupled to the antenna pattern 204 through the interconnections (for example, vias) within the RDL structure 200. The methods and materials used for forming the plurality of conductive traces 202 may be the same as or similar to those of the antenna pattern 204.

In some embodiments, the IMD layers 206a and 206b may be formed of organic materials, which include a polymer base material, non-organic materials, which include silicon nitride ($SiN_x$), silicon oxide ($SiO_x$), graphene, or the like. In some embodiments, the IMD layers 206a and 206b may be formed of a high-k dielectric layer (k is the dielectric constant of the dielectric layer). In some other embodiments, the IMD layers 206a and 206b may be formed of a photosensitive material, such as a dry film photoresist, or a taping film. However, it should be noted that the number of conductive traces 202 and the number of IMD layers 200a-200b shown in FIG. 1A is only an example and is not a limitation to the present invention.

As shown in FIG. 7A, the semiconductor die 110 is disposed on the first surface 201 of the RDL structure 200 and electrically coupled to the RDL structure 200. The semiconductor die 110 is fabricated by a flip-chip technology. The semiconductor die 110 has a back side 114 and a front side 112. The semiconductor die 110 includes pads 116 on the front side 112 of the semiconductor die 110 and close to the first surface 201 of the RDL structure 200. That is to say, the pads 116 are disposed between the front side 112 of the semiconductor die 110 and the first surface 201 of the RDL structure 200. The pads 116 are electrically connected to the circuitry (not shown) to transmit input/output (I/O), ground or power signals from the semiconductor die 110. In some embodiments, the pads 116 belong to the uppermost metal layer of the interconnection structure (not shown) of the semiconductor die 110. Also, the pads 116 of the semiconductor die 110 are electrically connected to the plurality of conductive traces 202 of the RDL structure 200. The antenna pattern 204 and the plurality of first conductive traces 202 of the RDL structure 200 are disposed above the pads 116 of the semiconductor die 110. It should be noted that the semiconductor die 110 is spaced apart from the antenna pattern 204 through the plurality of first conductive traces 202 of the RDL structure 200.

In some embodiments, as shown in FIG. 7A, the semiconductor die 110 may include a microcontroller (MCU), a microprocessor (MPU), a random access memory (RAM) (including a dynamic random access memory (DRAM)), a power management integrated circuit (PMIC), a flash memory, a global positioning system (GPS) device or a radio frequency (RF) device or any combination thereof.

In some other embodiments, the first semiconductor package 50a may also include another semiconductor die 210. The second semiconductor die is disposed on the first surface 201 of the RDL layer structure 200, and the semiconductor die 110 and the semiconductor die 210 are arranged side-by-side.

The semiconductor die 210 is also fabricated by a flip-chip technology. The semiconductor die 210 has a back side 214 and a front side 212. The semiconductor die 210 include pads 216 on the front side 212 of the semiconductor die 210 to electrically connect to the plurality of conductive traces 202 of the RDL structure 200. The semiconductor die 210, however, may have functions that are the same as or different from the semiconductor die 110. The semiconductor die 210, for example, may include a microcontroller (MCU), a microprocessor (MPU), a random access memory (RAM) (including a dynamic random access memory (DRAM)), a power management integrated circuit (PMIC), a flash memory, a global positioning system (GPS) device or a radio frequency (RF) device. It should be noted that the number of semiconductor dies integrated in the semiconductor package assembly 500a is not limited to the disclosed embodiment.

As shown in FIG. 7A, the first semiconductor package 50a further includes a molding compound 220 covering and surrounding the semiconductor dies 110 and 210. The molding compound 220 has opposite surfaces 228 and 232. The surface 228 is close to the front sides 114 and 214 of the semiconductor dies 110 and 210, and is in contact with the first surface 201 of the RDL structure 200. The surface 232 is close to the back sides 114 and 214 of the semiconductor dies 110 and 210, and is away from the first surface 201 of the RDL structure 200. The molding compound 220 is in contact with the first surface 201 of the RDL structure 200 and the semiconductor dies 110 and 210. The surface 232 of the molding compound 220 may be aligned with the back sides 114 and 214 of the semiconductor dies 110 and 210. Therefore, the back sides 114 and 214 of the semiconductor dies 110 and 210 may be exposed to the molding compound 220.

In some embodiments, the molded compound 220 may be formed of a nonconductive material, such as an epoxy, a resin, a moldable polymer, or the like. The molding compound 220 may be applied while substantially liquid, and then may be cured through a chemical reaction, such as in an epoxy or resin. In some other embodiments, the molding compound 220 may be an ultraviolet (UV) or thermally cured polymer applied as a gel or malleable solid capable of being disposed around the semiconductor dies 110 and 210, and then may be cured through a UV or thermal curing process. The molding compound 220 may be cured with a mold (not shown).

As shown in FIG. 7A, the first semiconductor package 50a further includes a plurality of vias 222 passing through the molding compound 220. The plurality of vias 222 is electrically connected to the plurality of conductive traces 202 of the RDL structure 200. Also, the semiconductor dies 110 and 210 are surrounded by the plurality of vias 222. In some embodiments, the plurality of vias 222 may comprise through package vias (TPVs) formed of copper.

As shown in FIG. 7A, the semiconductor package assembly 500a includes a plurality of conductive structures 226 disposed on the first surface 201 of the RDL structure 200.

The plurality of conductive structures 226 is electrically coupled to the plurality of conductive traces 202 of the RDL structure 200 through the plurality of corresponding vias 222, respectively. The plurality of conductive structures 226 is spaced apart from the antenna pattern 204 of the RDL structure 200 through the plurality of conductive traces 202 of the RDL structure 200. Also, the plurality of conductive structures 226 is separated from the RDL structure 200 through the plurality of vias 222 and the molding compound 220. That is to say, the plurality of vias 22 forms a plurality of electrical connections between the RDL structure 200 and the plurality of conductive structures 226.

As shown in FIG. 7A, the surface 232 of the molding compound 220 away from the RDL structure 200 is in a position between the plurality of vias 222 and the plurality of conductive structures 226. The plurality of conductive structures 226 are disposed on the back sides 114 and 214 of the semiconductor dies 110 and 210. Moreover, the semiconductor dies 110 and 210, and the plurality of conductive structures 226 are disposed close to the first surface 201 of the RDL structure 200 rather than the second surface 203 of the RDL structure 200. In some embodiments, the conductive structures 226 may comprise a conductive bump structure such as a copper bump or a solder bump structure, a conductive pillar structure, a conductive wire structure, or a conductive paste structure.

As shown in FIG. 7A, the plurality of conductive traces 202 of the RDL structure 200 may be designed to fan out from one or more of the pads 116 and 216 of the semiconductor dies 110 and 210 to provide electrical connections between the semiconductor dies 110 and 210 and the conductive structures 226. Therefore, the conductive structures 226 may have a larger bond pitch than the pads 116 and 216 of the semiconductor dies 110 and 210, which may be suitable for a ball grid array or another package mounting system.

In some embodiments, as shown in FIG. 7A, the first semiconductor package 50a further includes an optional passivation layer 230 covering the second surface 203 of the RDL layer 200. The passivation layer 230 is in contact with the top surface 205 of the antenna pattern 204. The passivation layer 230 is used to protect the antenna pattern 204 from damage. The passivation layer 230 may be composed of a material that is the same as or different from that of IMD layers 206a and 206b. For example, the passivation layer 230 may be formed of an epoxy, a solder mask, an inorganic material (e.g., silicon nitride ($SiN_x$), silicon oxide ($SiO_x$)), an organic polymer base material, or the like. In cases where the antenna pattern 204 is embedded within the IMD layer 206b, the passivation layer 230 may be omitted.

In some embodiments, as shown in FIG. 7A, the first semiconductor package 50a further includes a passivation layer 330 covering the semiconductor dies 110 and 210. The passivation layer 330 and the RDL layer 200 cover the opposite surfaces 228 and 232 of the molding compound 220, respectively. The passivation layer 330 has openings (not shown) corresponding to the plurality of conductive structures 226 to facilitate electrical connections between the plurality of vias 222 and the plurality of conductive structures 226. In some embodiments, the passivation layer 330 may be composed of a material that is the same as the passivation layer 230.

FIG. 7B is a plan view of second surface 203 of the RDL structure 200. FIG. 7B also shows a plan view of the antenna pattern 204 integrated within the RDL structure 200. In some embodiments, the antenna pattern 204 is a fence pattern in a top view. However, it should be understood that those of ordinary skill in the art know that various shapes can be used for the antenna pattern 204.

Figure 8:
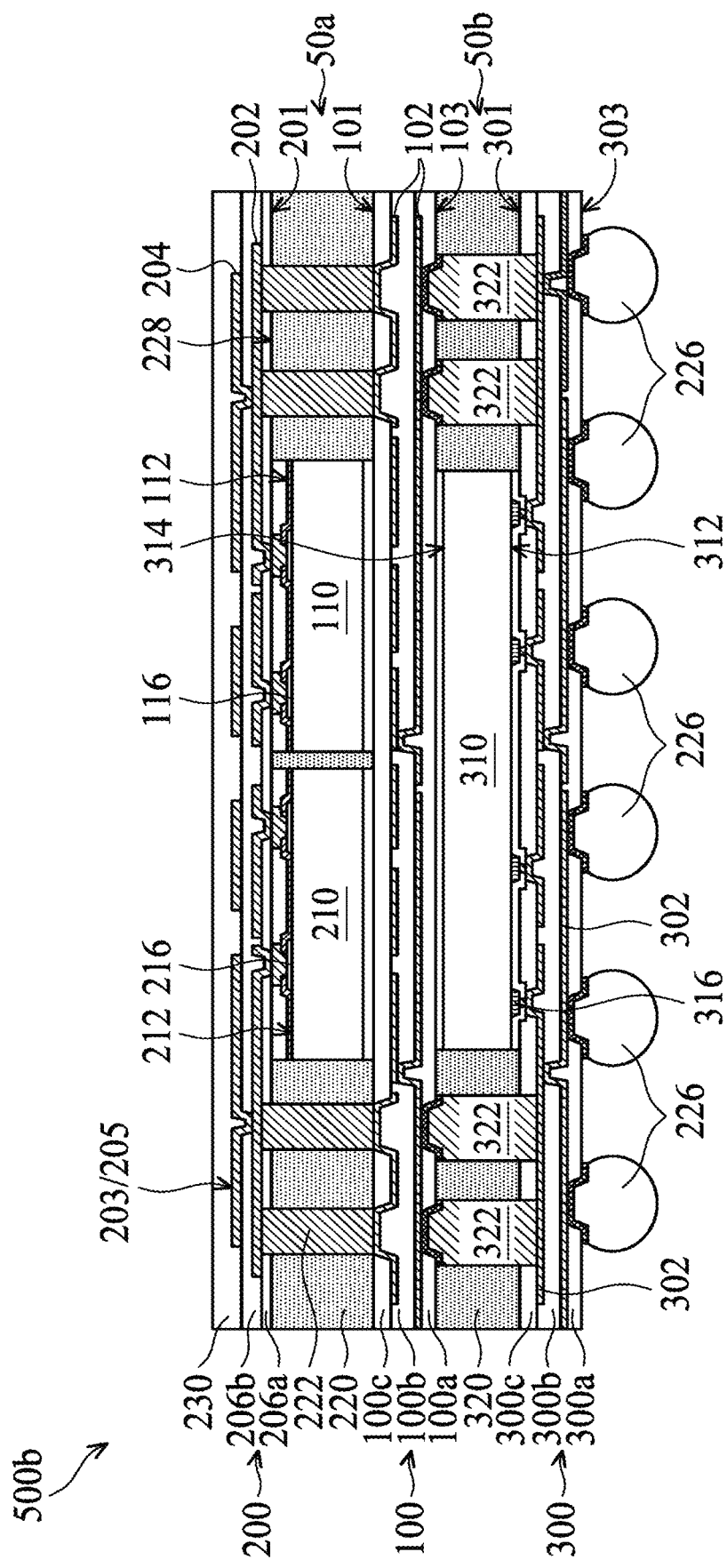
FIG. 8 is a cross-sectional view of a semiconductor package assembly with a package-on-package (POP) structure including a fan-out wafer-level semiconductor package (FOWLP) as shown in FIG. 7A in accordance with some embodiments of the disclosure.

FIG. 8 is a cross-sectional view of a semiconductor package assembly 500b with a package-on-package (POP) structure including the fan-out wafer-level semiconductor package (FOWLP) 50a as shown in FIG. 7A in accordance with some embodiments of the disclosure. Elements of the embodiments hereinafter that are the same or similar as those previously described with reference to FIG. 7A, are not repeated for brevity. The difference between the semiconductor package assembly 500a and the semiconductor package assembly 500b is that the semiconductor package assembly 500b includes a second semiconductor package 50b stacked below the first semiconductor package 50a.

As shown in FIG. 8, the first semiconductor package 50a further includes an RDL structure 100. The second semiconductor package 50b connects to the first semiconductor package 50a through the RDL structure 100. The RDL structure 100 is disposed on the first surface 201 of the RDL structure 200. The RDL structure 100 is electrically coupled to the RDL structure 200 of the first semiconductor package 50a. The RDL structure 100 has opposite surfaces 101 and 103. The surface 101 is in contact with the surface 232 of the molding compound 220 of the first semiconductor package 50a.

In some embodiments, the difference between the RDL structure 100 and the RDL structure 200 of the first semiconductor package 50a is that the RDL structure 100 is formed without any antenna patterns integrated within.

As shown in FIG. 8, the RDL structure 100 may have one or more conductive traces 102 disposed in one or more IMD layers, for example, IMD layers 100a-100c. The conductive traces 102 are electrically connected to the RDL structure 200 through the plurality of vias 222 of the first semiconductor package 50a. However, it should be noted that the number of conductive traces 102 and the number of IMD layers 100a-100c shown in FIG. 2 is only an example and is not a limitation to the present invention.

In some embodiments, as shown in FIG. 8, the RDL structure 100, which is referred to as a fan-out structure, may be designed to fan out from one or more of the plurality of vias 222, the positions of which have been redistributed by the RDL structure 200. Therefore, the RDL structure 100 may provide design flexibility for the electrical connections between the first semiconductor package 50a and the second semiconductor package 50b.

Alternatively, the first semiconductor package 50a may be electrically connected to the second semiconductor package 50b through the plurality of vias 222 without using the RDL structure 100.

As shown in FIG. 8, the second semiconductor package 50b includes a redistribution layer (RDL) structure 300, and at least one semiconductor die 310. The semiconductor die 310 is also fabricated by a flip-chip technology. The semiconductor die 310 has a back side 314 and a front side 312. The semiconductor die 310 includes pads 316 on the front side 312 of the semiconductor die 310 to electrically connect to the RDL structure 300. Also, the front side 312 of the semiconductor die 310 is close to the RDL structure 300. The semiconductor die 310, however, may have functions that are the same as or different from those of the semiconductor dies 110 and 210 of the first semiconductor package 50a. The semiconductor die 310, for example, may include a microcontroller (MCU), a microprocessor (MPU), a random access memory (RAM) (including a dynamic random access memory (DRAM)), a power management integrated circuit (PMIC), a flash memory, a global positioning system (GPS) device or a radio frequency (RF) device. It should be noted that the number of semiconductor dies integrated in the semiconductor package assembly 500b is not limited to the disclosed embodiment.

It should be noted that the back sides 114 and 214 of the semiconductor dies 110 and 210 of the first semiconductor package 50a are separated from the back side 314 of the semiconductor die 310 of the second semiconductor package 50b through the RDL structure 100. Also, the pads 116 and 216 of the semiconductor dies 110 and 210 and the pads 316 of the semiconductor die 310 face away from the RDL structure 100.

As shown in FIG. 8, the RDL structure 300, which is also referred to as a fan-out structure, has a third surface 301 and a fourth surface 303 opposite thereto. The semiconductor die 310 is disposed on the third surface 301 of the RDL structure 300. The semiconductor die 310 is electrically connected to the RDL structure 300 through the pads 311 disposed between the front side 312 of the semiconductor die 310 and the third surface of the RDL structure 300.

In some embodiments, the RDL structure 300 has a structure that is the same as or similar to the RDL structure 100. The RDL structure 300 may have one or more conductive traces 302 disposed in one or more IMD layers, such as IMD layers 300a-300c. In some embodiments, the IMD layers 300a-300c may be composed of a material that is the same as the IMD layers 100a-100c. The RDL structure 300 is formed without any antenna patterns integrated within. However, it should be noted that the number of conductive traces 202 and the number of IMD layers 200a-100c shown in FIG. 8 is only an example and is not a limitation to the present invention.

As shown in FIG. 8, the second semiconductor package 50b includes a molding compound 320 surrounding the semiconductor die 310. The, molding compound 320 is in contact with the third surface 301 of the RDL structure 300 and the surface of the RDL structure 100. Also, the molding compound 320 is in contact with the semiconductor die 310. The surface 103 of the RDL structure 100 is in contact with the surface 232 of the molding compound 320 of the second semiconductor package 50b. In some embodiments, the methods and materials used for forming the molding compound 320 may be the same as or similar to those of the molding compound 220.

As shown in FIG. 8, the second semiconductor package 50b further includes a plurality of vias 322 passing through the molding compound 320. The plurality of vias 322 is electrically connected to the conductive traces 102 of the RDL structure 100 and the conductive traces 302 of the RDL structure 300. The plurality of vias 322 may form electrical connections between the RDL structure 100 and the RDL structure 300. Also, the semiconductor die 310 is surrounded by the plurality of vias 322. In some embodiments, the plurality of vias 322 may comprise through package vias (TPVs) formed of copper.

As shown in FIG. 8, the semiconductor package assembly 500b includes a plurality of conductive structures 226 disposed on the fourth surface 303 of the RDL structure 300. The plurality of conductive structures 226 is electrically coupled to the conductive traces 302 of the RDL structure 300. The plurality of conductive structures 226 is electrically coupled to the plurality of conductive traces 202 of the RDL structure 200 through the RDL structures 100 and 300, and the plurality of corresponding vias 222 and 322. Also, the semiconductor die 310 is separated from the plurality of conductive structures 226 through the RDL structure 300.

Figure 9:
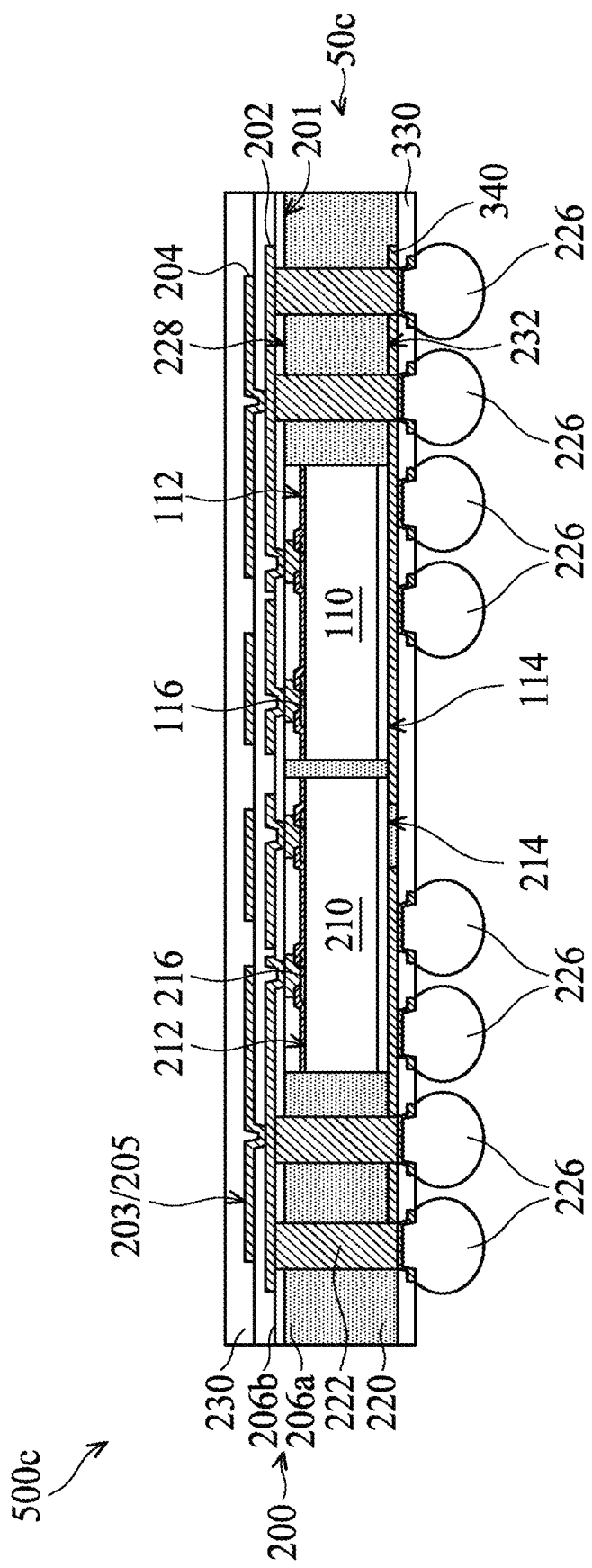
FIG. 9 is a cross-sectional view of a semiconductor package assembly in accordance with some embodiments of the disclosure.

FIG. 9 is a cross-sectional view of a semiconductor package assembly 500c in accordance with some embodiments of the disclosure. Elements of the embodiments hereinafter that are the same or similar as those previously described with reference to FIG. 7A, are not repeated for brevity. As shown in FIG. 9, the semiconductor package assembly 500c includes a third semiconductor package 50c. The difference between the semiconductor package assembly 500a and the semiconductor package assembly 500c is that the third semiconductor package 50c of the semiconductor package assembly 500c includes an additional redistribution layer (RDL) structure 340 disposed on the back sides 114 and 214 of the semiconductor dies 110 and 210. The plurality of conductive structures 226 is electrically coupled to the RDL structure 340. The third semiconductor package 50c may further include a passivation layer 330 covering the RDL structure 340.

In some embodiments, the RDL structure 340 may include conductive traces at the same layer-level without covered by any IMD layers. In some embodiments, as shown in FIG. 9, the RDL structure 340 may serve as conductive traces 340. The conductive traces 340 are disposed on and extended along the surface 232 of the molding compound 220. The RDL structure 340 is formed without any antenna patterns integrated within. In some other embodiments, the RDL structure 340 may have a structure that is the same as or similar to the RDL structure 300 shown in FIG. 8.

In some embodiments, as shown in FIG. 3, the RDL structure 340, which is referred to as a fan-out structure, may be designed to fan out from one or more of the plurality of vias 222, the positions of which have been redistributed by the RDL structure 200, to provide additional electrical connections between the semiconductor dies 110 and 210 and the conductive structures 226. Therefore, the RDL structure 340 may improve the design flexibility of the arrangements of the conductive structures 226.

Figure 10:
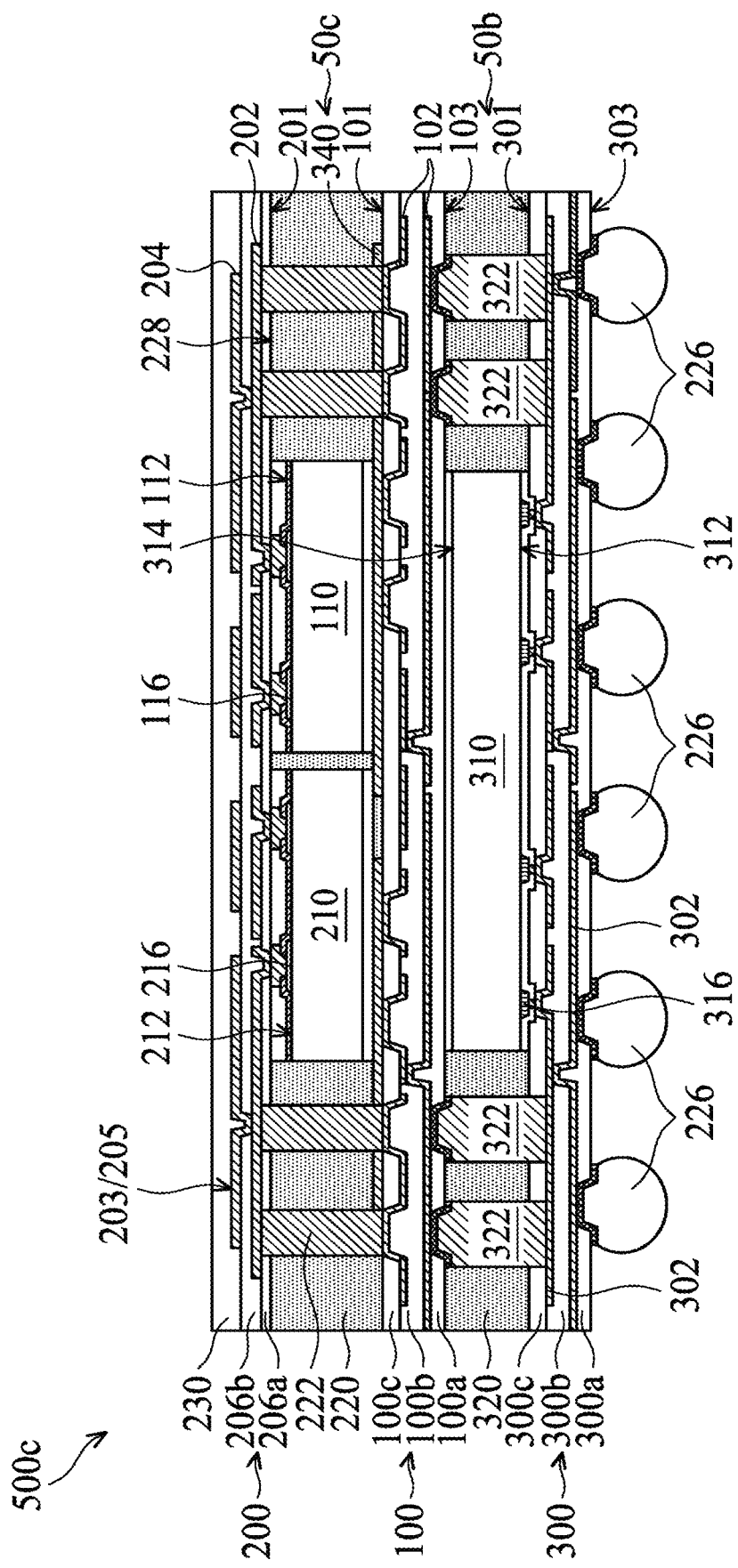
FIG. 10 is a cross-sectional view of a semiconductor package assembly with a package-on-package (POP) structure including a fan-out wafer-level semiconductor package (FOWLP) as shown in FIG. 9 in accordance with some embodiments of the disclosure.

FIG. 10 is a cross-sectional view of a semiconductor package assembly 500d with a package-on-package (POP) structure including the fan-out wafer-level semiconductor package (FOWLP) 50c as shown in FIG. 9 in accordance with some embodiments of the disclosure. Elements of the embodiments hereinafter that are the same or similar as those previously described with reference to FIGS. 7A, 8 and 9, are not repeated for brevity. The difference between the semiconductor package assembly 500c as shown in FIG. 9 and the semiconductor package assembly 500d is that the semiconductor package assembly 500d includes a second semiconductor package 50b stacked below the third semiconductor package 50c. Furthermore, the difference between the semiconductor package assembly 500b as shown in FIG. 8 and the semiconductor package assembly 500d is that the semiconductor package assembly 500d includes a third semiconductor package 50c vertically stacked on the second semiconductor package 50b.

In some embodiments, as shown in FIG. 10, the third semiconductor package 50c uses the RDL structure 340 and the RDL structure 100 to connect to the second semiconductor package 50b. The RDL structure 340 of the third semiconductor package 50c is electrically connected to the plurality of vias 222 of the third semiconductor package 50c and the plurality of vias 322 of the second semiconductor package 50b. It should be noted that the back sides 114 and 214 of the semiconductor dies 110 and 210 of the third semiconductor package 50c are separated from the back side 314 of the semiconductor die 310 of the second semiconductor package 50b through the RDL structure 340 and the RDL structure 100. Also, the pads 116 and 216 of the semiconductor dies 110 and 210 and the pads 316 of the semiconductor die 310 face away from the RDL structure 340 and the RDL structure 100.

Alternatively, the third semiconductor package 50c of the semiconductor package assembly 500d may only use the RDL structure 340 to connect to the second semiconductor package 50b.

Figure 11:
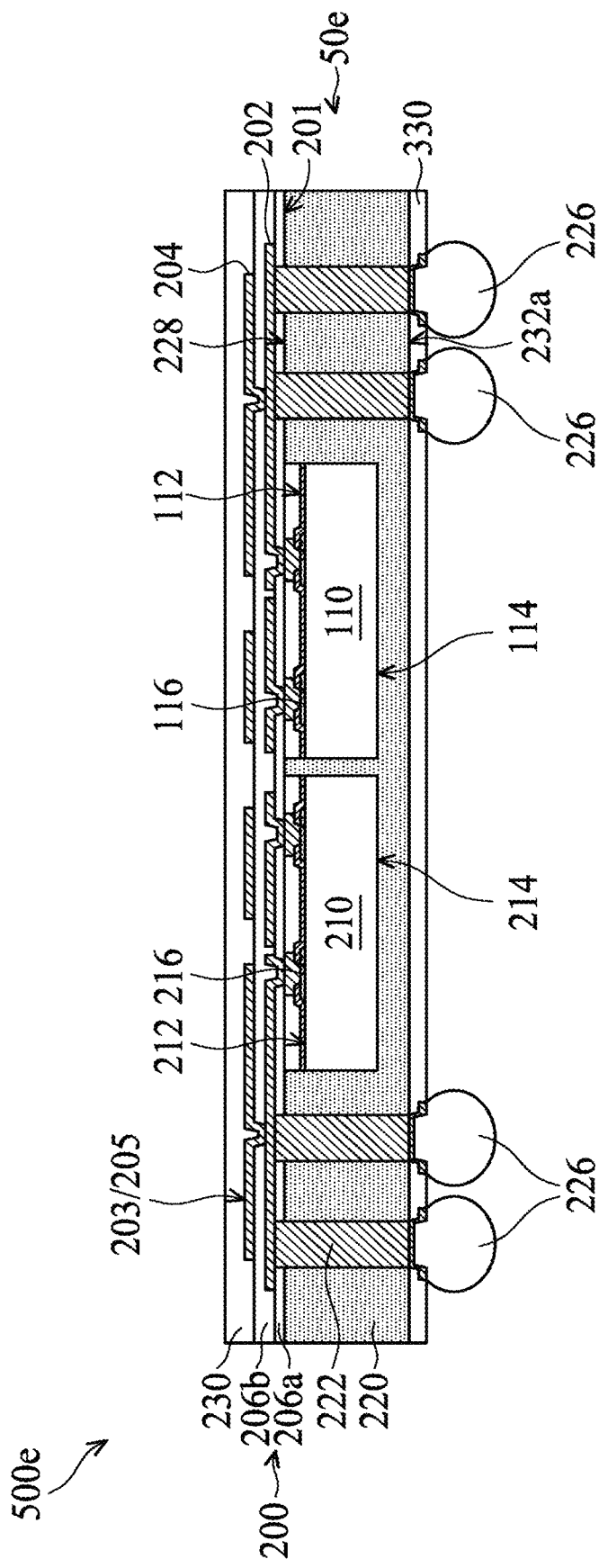
FIG. 11 is a cross-sectional view of a semiconductor package assembly in accordance with some embodiments of the disclosure.

FIG. 11 is a cross-sectional view of a semiconductor package assembly 500e in accordance with some embodiments of the disclosure. Elements of the embodiments hereinafter that are the same or similar as those previously described with reference to FIGS. 7A and 9, are not repeated for brevity. As shown in FIG. 11, the semiconductor package assembly 500e includes a fourth semiconductor package 50e. The difference between the semiconductor package assembly 500a and the semiconductor package assembly 500e is that the fourth semiconductor package 50e of the semiconductor package assembly 500e includes a molding compound 220a covering the back sides 114 and 214 of the semiconductor dies 110 and 210.

In some embodiments, as shown in FIG. 11, the molding compound 220a fully cover the back sides 114 and 214 of the semiconductor dies 110 and 210. The surface 232a of the molding compound 220a is not coplanar to the back sides 114 and 214 of the semiconductor dies 110 and 210.

Figure 12:
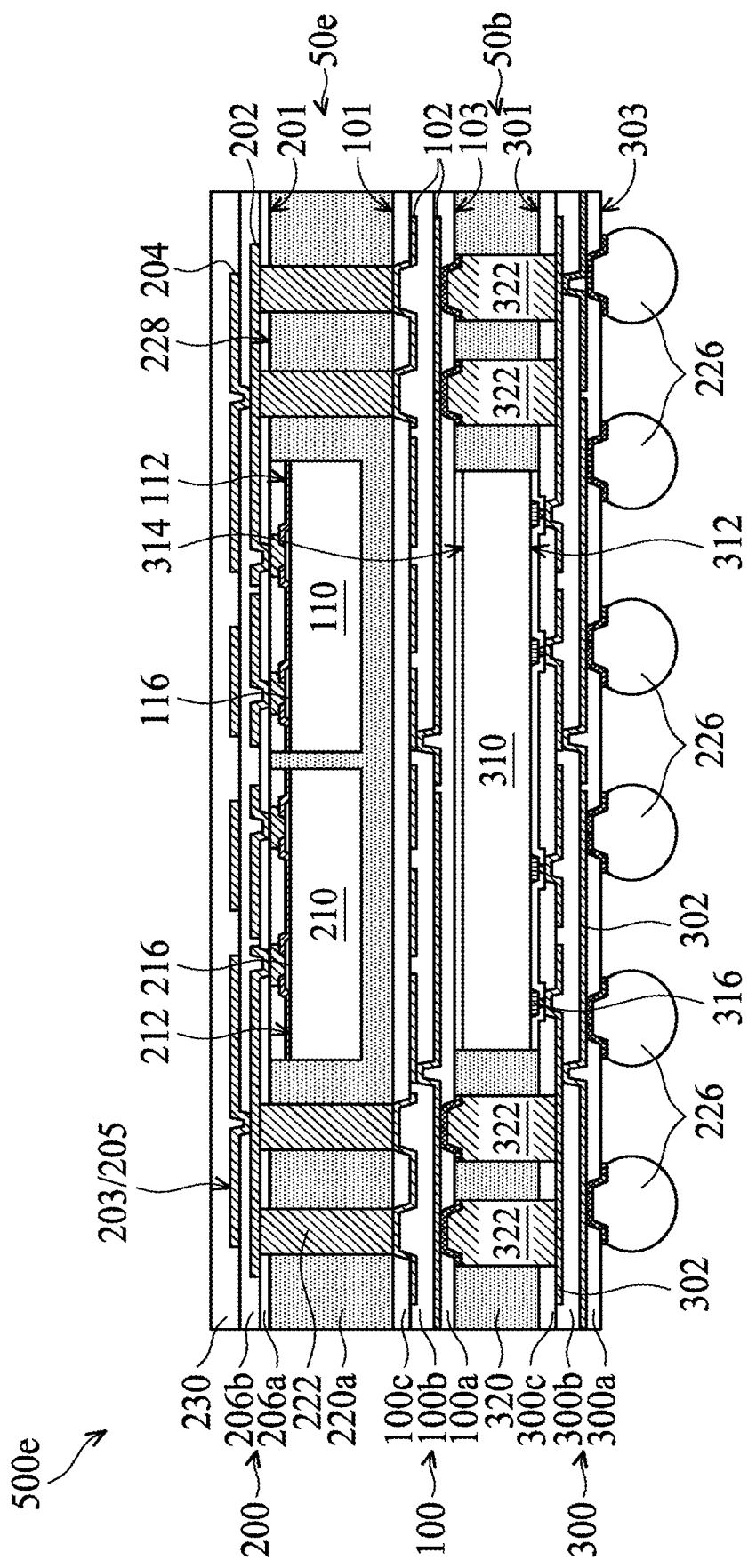
FIG. 12 is a cross-sectional view of a semiconductor package assembly with a package-on-package (POP) structure including a fan-out wafer-level semiconductor package (FOWLP) as shown in FIG. 11 in accordance with some embodiments of the disclosure.

FIG. 12 is a cross-sectional view of a semiconductor package assembly 500f with a package-on-package (POP) structure including a fan-out wafer-level semiconductor package (FOWLP) 50e as shown in FIG. 11 in accordance with some embodiments of the disclosure. Elements of the embodiments hereinafter that are the same or similar as those previously described with reference to FIGS. 7A, 8, 9 and 10, are not repeated for brevity. The difference between the semiconductor package assembly 500e as shown in FIG. 10 and the semiconductor package assembly 500f is that the semiconductor package assembly 500f includes a second semiconductor package 50b stacked below the fourth semiconductor package 50e. Furthermore, the difference between the semiconductor package assembly 500b as shown in FIG. 8 and the semiconductor package assembly 500f is that the semiconductor package assembly 500f includes a fourth semiconductor package 50e vertically stacked on the second semiconductor package 50b.

As shown in FIG. 12, the fourth semiconductor package 50e may further include an RDL structure 100. The second semiconductor package 50b connects to the fourth semiconductor package 50e through the RDL structure 100. The RDL structure 100 is disposed on the first surface 201 of the RDL structure 200. The RDL structure 100 is electrically coupled to the RDL structure 200 of the first semiconductor package 50a. The RDL structure 100 has opposite surfaces 101 and 103. The surface 101 is in contact with the surface 232 of the molding compound 220 of the fourth semiconductor package 50e. The surface 103 of the RDL structure 100 is in contact with the surface 232 of the molding compound 320 of the second semiconductor package 50b.

In some embodiments, the difference between the RDL structure 100 and the RDL structure 200 of the fourth semiconductor package 50e is that the RDL structure 100 is formed without any antenna patterns integrated within.

Alternatively, the fourth semiconductor package 50e may be electrically connected to the second semiconductor package 50b through the plurality of vias 222 without using the RDL structure 100.

Figure 13:
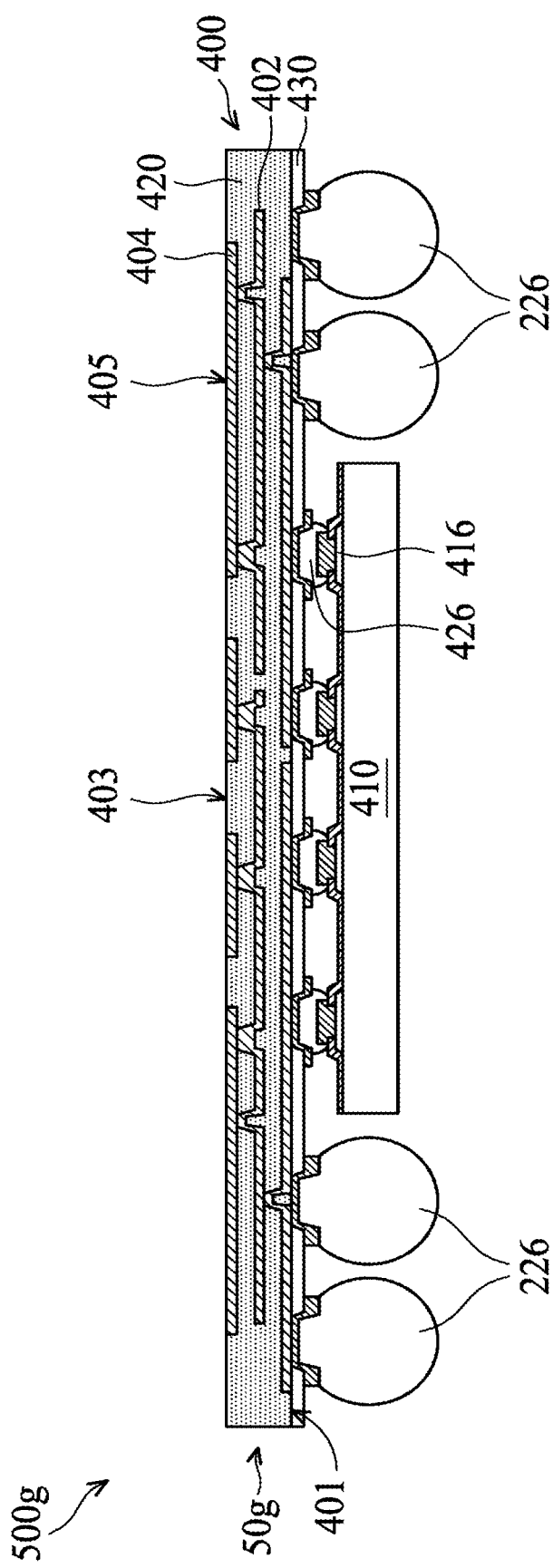
FIG. 13 is a cross-sectional view of a semiconductor package assembly in accordance with some embodiments of the disclosure.

FIG. 13 is a cross-sectional view of a semiconductor package assembly 500g in accordance with some embodiments of the disclosure. Elements of the embodiments hereinafter that are the same or similar as those previously described with reference to FIGS. 7A, 9 and 11, are not repeated for brevity. In some embodiments, the semiconductor package assembly 500g is a molded interposer semiconductor package (MIP) assembly. As shown in FIG. 13, the semiconductor package assembly 500g includes a fifth semiconductor package 50g that may serve as a molded interposer semiconductor package (MIP) 50g. The fifth semiconductor package 50g is mounted on the base (not shown), for example a printed circuit board (PCB) formed of polypropylene (PP), by a bonding process.

As shown in FIG. 13, the fifth semiconductor package 50g includes a redistribution layer (RDL) structure 400, a plurality of first conductive structures 226 and an electronic component 410. In this embodiment, the RDL structure 400 is a molded interposer structure. Also, the molded interposer structure is referred to as a fan-out structure. The RDL structure 400 includes a plurality of conductive traces 402, an antenna pattern 404 and a molding material 420. The RDL structure 400 has a first surface 401 and a second surface 403 opposite to the first substrate 401. The plurality of conductive traces 402 is disposed close to the first surface 401 of the RDL structure 400. The antenna pattern 404 is disposed close to the second surface 403 of the RDL structure 400. The plurality of conductive traces 402 and the antenna pattern 404 are in different layer-levels, respectively. The plurality of conductive traces 402 is electrically coupled to the antenna pattern 404. The conductive traces 402 may be formed of copper (Cu).

The molding material 420 encapsulates the conductive traces 402 and the antenna pattern 404 leaving the top surface 405 of the antenna pattern 404 exposed. Also, the molding material 420 fills the gaps between the antenna pattern 404 and the plurality of conductive traces 402. Therefore, the top surface 405 of the antenna pattern 404 is aligned with the second surface 403 of the RDL structure 400. In one embodiment, the molding material 420 may be formed of molding materials such as resin. Also, the molding material 420 has an all-in-one structure.

In some other embodiments, the fifth semiconductor package 50g further includes an optional passivation layer (not shown) covering the second surface 403 of the RDL layer 400. The passivation layer is used to protect the antenna pattern 204 from damage. Therefore, the passivation layer has a similar function as the passivation layer 230 shown in FIG. 7A. The passivation layer may be composed of a material that is the same as the passivation layer 230 shown in FIG. 7A.

In some embodiments, as shown in FIG. 13, the fifth semiconductor package 50g may further include a passivation layer 430 directly covering the first surface 401 of the RDL structure 400. The passivation layer 430 has openings (in positions where the plurality of conductive structures 226 pass through) corresponding to the plurality of conductive structures 226 to facilitate forming electrical connections between the plurality of conductive traces 402 and the plurality of conductive structures 226. In some embodiments, the passivation layer 430 may be formed of an epoxy, a solder mask, an inorganic material (e.g., silicon nitride ($SiN_x$), silicon oxide ($SiO_x$)), an organic polymer base material, or the like.

As shown in FIG. 13, the plurality of conductive structures 226 is disposed on the first surface 401 of the RDL structure 400. The plurality of conductive structures 226 is formed through the openings (not shown) of the passivation layer 430 to electrically connect to the plurality of conductive traces 402 of the RDL structure 400, respectively. The plurality of conductive structures 226 is spaced apart from the antenna pattern 404 of the RDL structure 400 through the plurality of conductive traces 402 of the RDL structure 400.

In some embodiments, as shown in FIG. 13, the fifth semiconductor package 50g may carry at least one additional electronic component. As shown in FIG. 13, the fifth semiconductor package 50g further comprises a discrete electronic component 410 disposed on and close to the first surface 401 of the RDL structure 400. The electronic component 410 is surrounded by the plurality of conductive structures 226. Also, the electronic component 410 is spaced apart from the plurality of conductive structures 226. The electronic component 410 has pads 416 thereon. The pads 416 of the semiconductor die 410 are disposed close to the first surface 401 of the RDL structure 400. Also, the pads 416 are electrically connected to the plurality of conductive traces 402 of the RDL structure 400 through the plurality of corresponding conductive structures 426, respectively. In some embodiments, the conductive structures 426 may comprise a conductive bump structure such as a copper bump or a solder bump structure.

In some embodiments, the electronic component 410 may include a semiconductor die. The semiconductor die, for example, may include a microcontroller (MCU), a microprocessor (MPU), a random access memory (RAM) (including a dynamic random access memory (DRAM)), a power management integrated circuit (PMIC), a flash memory, a global positioning system (GPS) device or a radio frequency (RF) device or any combination thereof. In some other embodiments, the electronic component 410 may include an integrated passive device (IPD). The IPD may include a capacitor, an inductor, a resistor or a combination thereof. It should be noted that the electronic component 410 is not encapsulated by molding materials.

Figure 14:
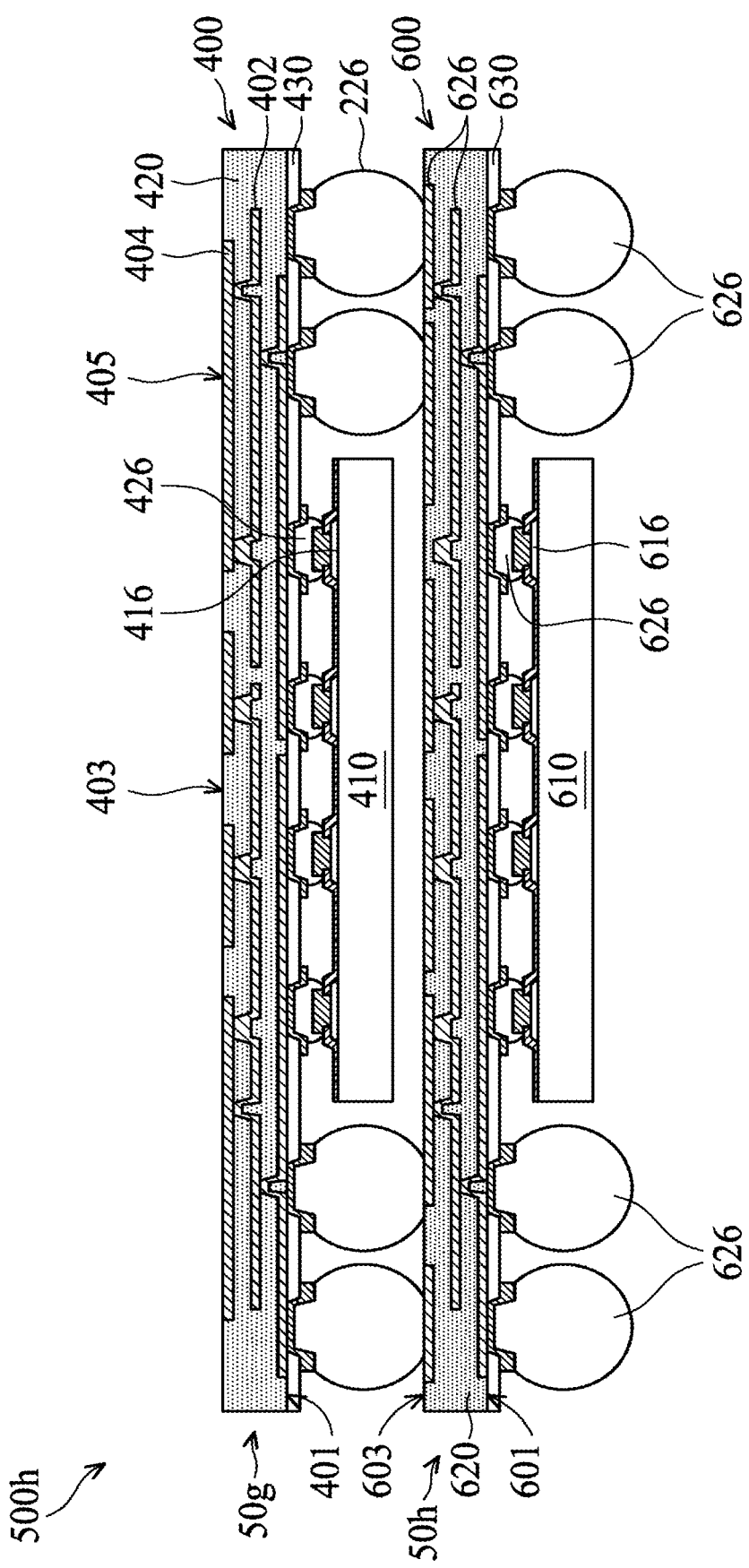
FIG. 14 is a cross-sectional view of a semiconductor package assembly with a package-on-package (POP) structure including a molded interposer package (MIP) as shown in FIG. 13 in accordance with some embodiments of the disclosure.

FIG. 14 is a cross-sectional view of a semiconductor package assembly 500h with a package-on-package (POP) structure including the molded interposer package (MIP) 50g shown in FIG. 13 in accordance with some embodiments of the disclosure. Elements of the embodiments hereinafter that are the same or similar as those previously described with reference to FIG. 13, are not repeated for brevity. The difference between the semiconductor package assembly 500g shown in FIG. 7 and the semiconductor package assembly 500h is that the semiconductor package assembly 500h includes a sixth semiconductor package 50h stacked below the fifth semiconductor package 50g.

In some embodiments, as shown in FIG. 8, the sixth semiconductor package 50h includes a redistribution layer (RDL) structure 600, a plurality of second conductive structures 626 and a discrete electronic component 610. In this embodiment, the RDL structure 600 is also a molded interposer structure. Also, the molded interposer structure is referred to as a fan-out structure. The RDL structure 600 has a first surface 601 and a second surface 603 opposite to the first substrate 601. The RDL structure 600 includes a plurality of conductive traces 602 and a molding material 620 filling the gaps between the plurality of conductive traces 602. In some embodiments, the difference between the RDL structure 600 and the RDL structure 400 of the fourth semiconductor package 50e is that the RDL structure 600 is formed without any antenna patterns integrated within.

As shown in FIG. 14, the RDL structure 600 is disposed on the first surface 401 of the RDL structure 400 of the fifth semiconductor package 50g. The RDL structure 600 is electrically coupled to the RDL structure 400 through the plurality of conductive structures 226 therebetween. Also, the plurality of conductive structures 226 of the fifth semiconductor package 50g is in contact with the second surface 603 of the RDL structure 600.

In some embodiments, as shown in FIG. 14, the sixth semiconductor package 50h may further include a passivation layer 630 directly covering the third surface 601 of the RDL structure 600. The methods and materials used for forming the passivation layer 630 may be the same as or similar to those of the passivation layer 430.

As shown in FIG. 14, the plurality of conductive structures 626 is disposed on the third surface 601 of the RDL structure 600. The plurality of conductive structures 626 is formed through the openings (not shown) of the passivation layer 630 to electrically connect to the plurality of conductive traces 602 of the RDL structure 600, respectively. The plurality of conductive structures 626 is spaced apart from the antenna pattern 404 of the RDL structure 400 through the plurality of conductive traces 402 of the RDL structure 400 and the RDL structure 600. The methods and materials used for forming the plurality of conductive structures 626 may be the same as or similar to those of the plurality of conductive structures 426.

In some embodiments, as shown in FIG. 14, the sixth semiconductor package 50h may further comprise a discrete electronic component 610 disposed on the third surface 601 of the RDL structure 600. The electronic component 610 is surrounded by the plurality of conductive structures 626. Also, the electronic component 610 is spaced apart from the plurality of conductive structures 226. The electronic component 610 has pads 616 thereon. The pads 416 of the semiconductor die 610 are disposed close to the first surface 601 of the RDL structure 600. Also, the pads 616 are electrically connected to the plurality of conductive traces 602 of the RDL structure 600 through corresponding conductive structures 626, respectively. In some embodiments, the semiconductor die 610 may have functions that are the same as or different from those of the semiconductor die 410.

Embodiments provide semiconductor package assemblies 500a-500g. The semiconductor package assemblies 500a and 500g provide an antenna integrated into a single redistribution layer (RDL) structure. The RDL structure with an antenna integrated within can combine the functions of wireless communication in a single RDL structure. The antennas are electrically connected to the conductive traces through the interconnections within the RDL structure. Therefore, there is no need to perform a surface mount technology (SMT) process for forming the antenna device. Also, the integrated antennas can be separated from the semiconductor dies through conductive traces in the RDL structure. Therefore, the semiconductor dies and the conductive structures (e.g., a conductive bump structure, a conductive pillar structure, a conductive wire structure, or a conductive paste structure) can be disposed directly under the integrated antennas to increase the design flexibility of the system integration of the semiconductor package structure. The size of the semiconductor package can be reduced further. Moreover, an RDL structure with an antenna integrated within can be applied in a high-frequency application, such as a radio frequency (RF) system-in-package (SiP) assembly. Furthermore, the RDL structure with the antenna integrated within can be applied in a fan-out wafer-level semiconductor package (FOWLP). Also, the RDL structure with the antenna integrated within can be applied in molded interposer package (MIP). The antenna integrated into the RDL structure is compatible with the current fabrication processes for semiconductor packages. As a result, reliability, yield, and throughput of the semiconductor package structure is reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a first semiconductor die having a first side and an opposing second side, the second side comprising conductive pads;
a redistribution layer (RDL) structure comprising a first surface a second surface, and sidewalls extending between the first surface and the second surface, and the first surface disposed adjacent the second side of the first semiconductor die, wherein the RDL structure comprises:
a plurality of conductive traces comprising first conductive traces electrically coupled to the conductive pads of the first semiconductor die and second conductive traces electrically coupled to the first conductive traces; and
an inter-metallic dielectric (IMD) layer disposed between the first conductive traces and the second conductive traces of the plurality of conductive traces;
a conductive electromagnetic shield layer covering the first side of the first semiconductor die and the sidewalls of the RDL structure from the first surface to the second surface of the RDL structure, wherein the conductive electromagnetic shield layer is electrically coupled to the RDL structure through one or more vias; and
a plurality of conductive structures disposed on and in direct physical contact with the second surface of the RDL structure and electrically coupled to the first semiconductor die through the plurality of conductive traces of the RDL structure.

2. The semiconductor package assembly of claim 1, further comprising a first dielectric layer disposed between the first side of the first semiconductor die and the conductive electromagnetic shield layer.

3. The semiconductor package assembly of claim 1, further comprising an electronic component disposed on the second surface of the RDL structure and electrically coupled to the plurality of conductive traces of the RDL structure.

4. The semiconductor package assembly of claim 3, wherein the electronic component comprises at least one of a capacitor, an inductor, and/or a resistor.

5. The semiconductor package assembly of claim 1, wherein the first semiconductor die is surrounded by a molding compound, the molding compound being in contact with the first surface of the RDL structure; and
the one or more vias extend through the molding compound to form electrical connections between the RDL structure and the conductive electromagnetic shield layer.

6. The semiconductor package assembly of claim 5, wherein the conductive electromagnetic shield layer covers sidewalls of the molding compound.

7. The semiconductor package assembly of claim 1, further comprising a dielectric layer covering an upper surface of the conductive electromagnetic shield layer.

8. The semiconductor package assembly of claim 1, further comprising a second semiconductor die, the second semiconductor die arranged side-by-side with the first semiconductor die.

9. A semiconductor package assembly, comprising:
a first semiconductor die having a first side and an opposing second side, the second side comprising conductive pads;
a first redistribution layer (RDL) structure comprising a first surface an opposing second surface, and first sidewalls extending between the first surface and the second surface, wherein the first surface is disposed adjacent the second side of the first semiconductor die, and wherein the first RDL structure comprises:
a first plurality of conductive traces comprising first conductive traces electrically coupled to the conductive pads of the first semiconductor die and second conductive traces electrically coupled to the first conductive traces; and
a first inter-metallic dielectric (IMD) layer disposed between the first conductive traces and the second conductive traces of the first plurality of conductive traces;
a conductive electromagnetic shield layer covering the first side of the first semiconductor die, wherein the conductive electromagnetic shield layer is electrically coupled to the first RDL structure through one or more first vias;
a second semiconductor die having a third side and an opposing fourth side, the fourth side comprising conductive pads, wherein the second semiconductor die is separated from the first semiconductor die by the first RDL structure;
a second redistribution layer (RDL) structure comprising a third surface an opposing fourth surface, and second sidewalls extending between the third surface and the fourth surface, wherein the third surface is disposed adjacent the fourth side of the second semiconductor die, and wherein the second RDL structure comprises:
a second plurality of conductive traces comprising third conductive traces electrically coupled to the conductive pads of the second semiconductor die and fourth conductive traces electrically coupled to the third conductive traces; and
a second inter-metallic dielectric (IMD) layer disposed between the third conductive traces and the fourth conductive traces of the second plurality of conductive traces, wherein the second RDL is electrically coupled to first RDL through one or more second vias; and
a plurality of conductive structures disposed on the fourth surface of the second RDL structure, wherein the plurality of conductive structures are electrically coupled to the second semiconductor die through the second plurality of conductive traces of the second RDL structure and are electrically coupled to the conductive electromagnetic shield layer through the first vias and the second vias, and wherein the conductive electromagnetic shield layer covers the first sidewalls of the first RDL structure and the second sidewalls of the second RDL structure.

10. The semiconductor package assembly of claim 9, further comprising a third semiconductor die arranged side-by-side with the first semiconductor die.

11. The semiconductor package assembly of claim 10, wherein the third semiconductor die comprises a fifth side and opposing sixth side, the sixth side comprising conductive pads, and wherein the conductive pads of the third semiconductor die are electrically coupled to the first conductive traces of the first RDL structure.

12. The semiconductor package assembly of claim 9, further comprising a first dielectric layer disposed between the first side of the first semiconductor die and the conductive electromagnetic shield layer.

13. The semiconductor package assembly of claim 9, wherein:
   the first semiconductor die is surrounded by a first molding compound, the first molding compound being in contact with the first surface of the first RDL structure; and
   the second semiconductor die is surrounded by a second molding compound, the second molding compound being in contact with the second surface of the first RDL structure and the third surface of the second RDL structure.

14. The semiconductor package assembly of claim 13, wherein:
   the one or more first vias extend through the first molding compound to form first electrical connections between the first RDL structure and the conductive electromagnetic shield layer; and
   the one or more second vias extend through the second molding compound to form second electrical connections between the first RDL structure and the second RDL structure.

15. The semiconductor package assembly of claim 13, wherein the conductive electromagnetic shield layer covers sidewalls of the first molding compound and sidewalls of the second molding compound.

16. The semiconductor package assembly of claim 9, further comprising a dielectric layer covering an upper surface of the conductive electromagnetic shield layer.

17. The semiconductor package assembly of claim 9, further comprising an electronic component disposed on the fourth surface of the second RDL structure and electrically coupled to the second plurality of conductive traces of the second RDL structure.

18. The semiconductor package assembly of claim 17, wherein the electronic component comprises at least one of a capacitor, an inductor, and/or a resistor.

* * * * *